US010837608B1

(12) United States Patent
Li et al.

(10) Patent No.: US 10,837,608 B1
(45) Date of Patent: Nov. 17, 2020

(54) FULL SPECTRUM WHITE LIGHT EMITTING DEVICES

(71) Applicant: Intematix Corporation, Fremont, CA (US)

(72) Inventors: Yi-Qun Li, Danville, CA (US); Xianglong Yuan, Manteca, CA (US); Jun-Gang Zhao, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 16/909,921

(22) Filed: Jun. 23, 2020

Related U.S. Application Data

(63) Continuation-in-part of application No. 16/954,925, and a continuation-in-part of application No.
(Continued)

(51) Int. Cl.
*H01L 25/075* (2006.01)
*H01L 33/50* (2010.01)
(Continued)

(52) U.S. Cl.
CPC ............. *F21K 9/64* (2016.08); *F21V 15/01* (2013.01); *H01L 25/0753* (2013.01);
(Continued)

(58) Field of Classification Search
CPC ..... H01L 25/0753; H01L 33/06; H01L 33/08; H01L 33/32
See application file for complete search history.

(56) References Cited

U.S. PATENT DOCUMENTS 8,188,492 B2  5/2012  Lee et al.
8,890,403 B2  11/2014  Sakuta et al.
(Continued)

FOREIGN PATENT DOCUMENTS

CN      103383074 A    11/2013
JP      2011192738 A   9/2011
(Continued)

OTHER PUBLICATIONS

Cong Feng, Jian-an Huang and H. W. Choi "Monolithic Broadband InGaN Light-Emitting Diode", ACS Photonics 2016, 3, 7, ACS Publications, p. 1294-1300.
(Continued)

*Primary Examiner* — Joseph L Williams

(57) ABSTRACT

A full spectrum white light emitting device may include a broadband solid-state excitation source for generating broadband excitation light with a dominant wavelength from about 420 nm to about 480 nm and a full width at half maximum intensity greater than about 25 nm; and a narrowband red photoluminescence material with an emission peak wavelength from about 620 nm to about 640 nm and a full width at half maximum emission intensity of less than about 30 nm; where the device has an efficacy of at least 130 lm/W and generates white light with a CRI Ra≥90, and where over a wavelength range from about 430 nm to about 520 nm, a maximum percentage intensity deviation of the white light from the intensity of light of a black-body curve or CIE Standard Illuminant D of the same Correlated Color Temperature is less than about 50%.

19 Claims, 19 Drawing Sheets

SECTION B-B

Related U.S. Application Data

16/903,251, filed on Jun. 16, 2020, which is a continuation of application No. 16/517,524, filed as application No. PCT/IB2019/001003 on Jun. 25, 2019, now Pat. No. 10,685,941, which is a continuation of application No. 16/212,687, filed on Dec. 7, 2018, now Pat. No. 10,371,325, which is a continuation of application No. 16/207,039, filed on Nov. 30, 2018, now abandoned.

(60) Provisional application No. 62/931,180, filed on Nov. 5, 2019, provisional application No. 62/872,277, filed on Jul. 10, 2019, provisional application No. 62/689,538, filed on Jun. 25, 2018.

(51) Int. Cl.

| | | |
|---|---|---|
| *H01L 33/08* | (2010.01) | |
| *H01L 33/32* | (2010.01) | |
| *H01L 33/06* | (2010.01) | |
| *F21K 9/64* | (2016.01) | |
| *F21V 15/01* | (2006.01) | |
| *H01L 33/62* | (2010.01) | |
| *H01L 33/54* | (2010.01) | |
| *F21Y 113/13* | (2016.01) | |
| *F21Y 115/10* | (2016.01) | |
| *F21Y 105/10* | (2016.01) | |

(52) U.S. Cl.
CPC ............ *H01L 33/06* (2013.01); *H01L 33/507* (2013.01); *H01L 33/54* (2013.01); *H01L 33/62* (2013.01); *F21Y 2105/10* (2016.08); *F21Y 2113/13* (2016.08); *F21Y 2115/10* (2016.08); *H01L 33/502* (2013.01)

(56) References Cited

U.S. PATENT DOCUMENTS

| | | |
|---|---|---|
| 9,004,705 B2 | 4/2015 | Li et al. |
| 9,590,149 B2 | 3/2017 | Lim et al. |
| 9,605,815 B2 | 3/2017 | Yamakawa et al. |
| 9,698,317 B2 | 7/2017 | Park et al. |
| 9,997,669 B2 | 6/2018 | Im et al. |
| 10,685,941 B1 | 6/2020 | Li et al. |
| 2002/0117674 A1 | 8/2002 | Sugawara |
| 2005/0161690 A1 | 7/2005 | Lai et al. |
| 2013/0114242 A1 | 5/2013 | Pickard et al. |
| 2014/0055982 A1 | 2/2014 | Tao et al. |

FOREIGN PATENT DOCUMENTS

| | | |
|---|---|---|
| JP | 2015126160 A | 7/2015 |
| TW | 201724553 A | 7/2017 |

OTHER PUBLICATIONS

ISR PCT/IB2019/001003.
Office Action, dated Dec. 2019; TW 108122226.
Rejection Decision, dated May 2020; TW 108122226.
U.S. Appl. No. 62/689,538.
U.S. Appl. No. 62/872,227.
U.S. Appl. No. 62/931,180.
Written Opinion PCT/IB2019/001003.

SECTION B-B

SECTION B-B

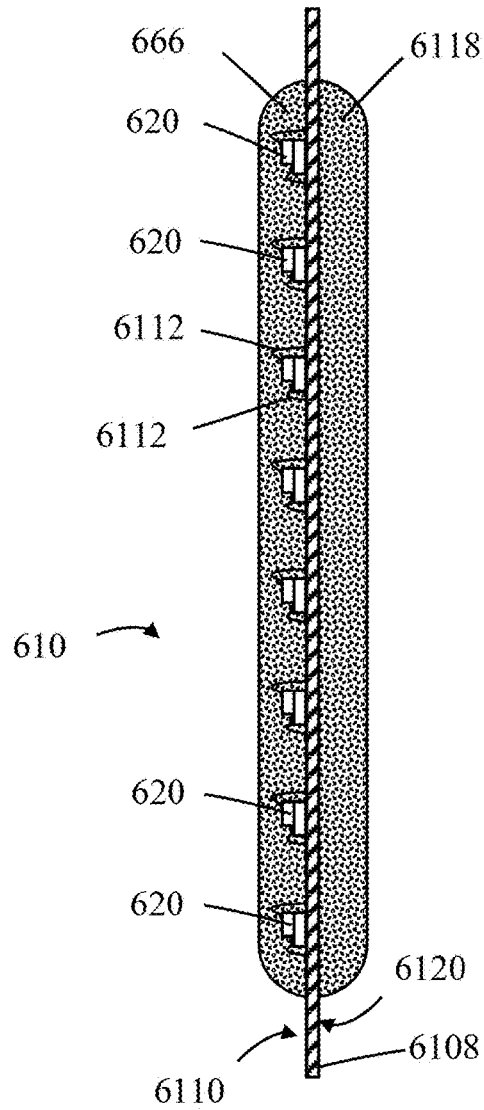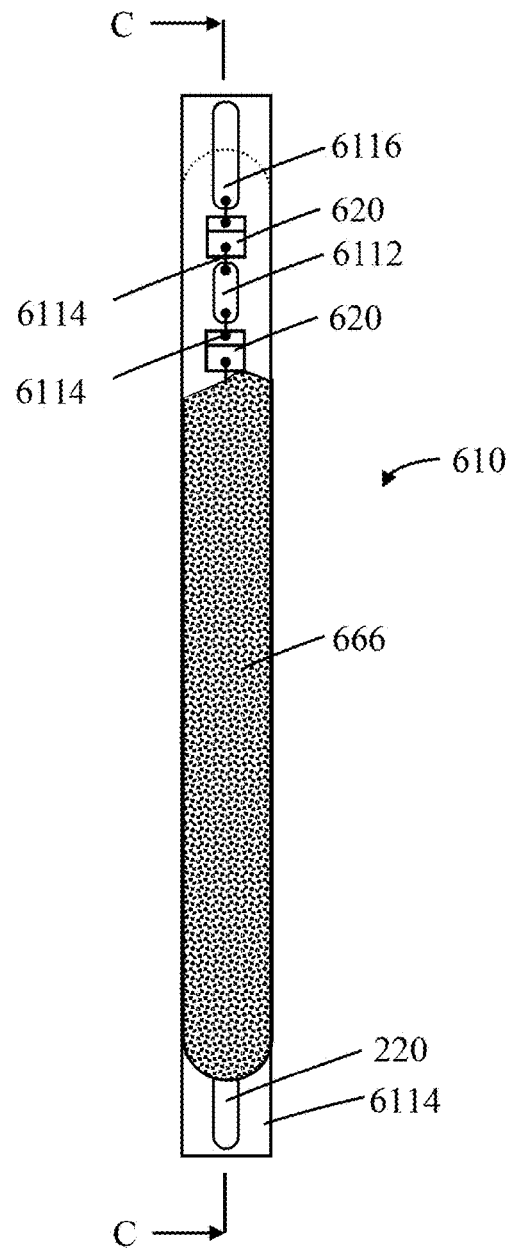
SECTION C-C
FIG. 6a
FIG. 6b

FULL SPECTRUM WHITE LIGHT EMITTING DEVICES

CROSS REFERENCE TO RELATED APPLICATIONS

This application is (1) a continuation-in-part of U.S. patent application Ser. No. 16/954,925, filed Jun. 17, 2020, which is a national phase application of PCT/US2019/38903 (also identified as PCT/IB2019/001003), filed Jun. 25, 2019, which in turn claims priority to U.S. patent application Ser. No. 16/212,687, filed Dec. 7, 2018, which in turn claims priority to U.S. patent application Ser. No. 16/207,039, filed Nov. 30, 2018, which in turn claims priority to U.S. provisional patent application Ser. No. 62/689,538, filed Jun. 25, 2018; and (2) a continuation-in-part of U.S. patent application Ser. No. 16/903,251, filed Jun. 16, 2020, which is a continuation of U.S. patent application Ser. No. 16/517,524, filed Jul. 19, 2019, and which claims priority to U.S. provisional patent application Ser. No. 62/872,277, filed Jul. 9, 2019; additionally, this application claims priority to U.S. provisional patent application Ser. 62/931,180, filed Nov. 5, 2019; all of which are hereby incorporated by reference in their entirety.

FIELD OF THE INVENTION

Embodiments of the present invention are directed to full spectrum solid-state white light emitting devices comprising photoluminescence wavelength conversion materials. More particularly, although not exclusively, embodiments concern white light emitting devices for generating full spectrum white light having a wavelength spectrum from blue light to red light that closely resembles natural sunlight.

BACKGROUND OF THE INVENTION

White light emitting LEDs ("white LEDs") include one or more photoluminescence materials (typically inorganic phosphor materials), which absorb a portion of the blue light emitted by the LED (solid-state excitation source) and re-emit visible light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high efficacy (100 lumens per watt and higher), white LEDs have rapidly replaced conventional fluorescent, compact fluorescent and incandescent lamps.

Various metrics exist for quantifying the characteristics and quality of light generated by white lighting sources. The two most commonly used metrics within the solid-state lighting industry are, Correlated Color Temperature (CCT) and International Commission on Illumination (CIE) General Color Rendering Index (CRI) Ra.

The CCT of a lighting source is measured in kelvin (K) and is the color temperature of a Planckian (black-body) radiator that radiates light of a color that corresponds to the color of the light generated by the lighting source.

The General CRI Ra characterizes how faithfully a lighting source renders the true colors of an object and is based on a measure of how well a lighting source's illumination of eight color test samples (R1 to R8) compares with the illumination provided by a reference source. In general, the higher the value indicates its closeness to a black radiator and natural sunlight. General CRI Ra can take negative values and has a maximum value of 100. Since the color samples R1 to R8 are all pastel colors (low saturation grayish red to reddish purple), the General CRI Ra gave a useful measure of subtle differences in light output of incandescent sources which generate a full spectrum that closely resembles sunlight. However, for white LEDs whose spectrum is composed of peaks the General CRI Ra is proving to be inadequate as it is an average measure of color rendition over a limited range of colors and gives no information of the lighting source's performance for particular colors or highly saturated colors. Thus, when characterizing full spectrum solid-state white light emitting devices the CRI color samples R9 to R12 (saturated red to saturated blue) and R13 to R15 (light skin tone, leaf green, medium skin tone) should be taken into account to give a meaningful characterization of the spectrum compared with natural sunlight.

To address the limitations of General CRI Ra, the Illuminating Engineering Society (IES) recently published the TM-30 standard for measuring and characterizing the color performance of lighting sources (Illuminating Engineering Society (2015) "Method for Evaluating Light Source Color Rendition" TM-30-15) which is herein incorporated by way of reference. Under the TM-30-15 standard, three metrics are used to characterize the color rendering characteristics of a lighting source, Fidelity Index ($R_f$), Gamut Index ($R_g$) and a Color Vector Graphic. It is believed that IES TM-30-15 method has better correlation with people's color perception and, therefore, gives a more accurate characterization of a lighting source's light characteristics. The Fidelity Index $R_f$ is similar to General CRI Ra and characterizes how faithfully a lighting source renders the true colors of an object and is based on a measure of how well a lighting source's illumination of 99 color samples compares with the illumination provided by a reference source. The Fidelity Index $R_f$ value ranges from 0 to 100. The new color samples have been selected to be more representative of objects that are likely to be encountered in real-life applications and as a result the Fidelity Index $R_f$ is believed to be a more accurate measure of color rendering than the General CRI Ra. Since $R_f$ is measured over a greater number of color samples, it will be more difficult to achieve high scores compared with the General CRI Ra. Moreover, due to the different testing procedures, General CRI Ra and Fidelity Index $R_f$ values are not comparable against each other.

The Gamut Index $R_g$ focuses on color saturation and is an average level of saturation compared with a reference source. The Gamut Index correlates to the vividness of the appearance of colored objects. The Gamut Index $R_g$ value ranges from 60 to 140 where values below 100 indicate decreased saturation and values above 100 indicate increased saturation compared with the reference source.

The Color Vector Graphic is a polar chart that gives a visual representation of how certain colors appear with the observed light, whether the colors show up dull or more vivid. The Color Vector Graphic gives an indication of which colors will be more or less saturated. Since Fidelity and Gamut indices are based on averages, it is not possible to tell which colors are saturated or dull. The circle of the vector graphic is divided into sixteen hue-angle bins hj (h stands for hue and j is the number of the hue angle bin) of the reference light. A Planckian (black-body) radiator appears as a circle on the color vector graphic. Any point where the local Fidelity Index $R_{f,hj}$ lies inside the circle indicates that these hues are desaturated by the light source as compared with the reference source (black-body). Points where $R_{f,hj}$ lie outside of the circle indicates hues that are oversaturated by the light source. A perfect overlap indicates that there is no difference in color rendering between the sources.

Good lighting design is inherently human centric since lighting can affect human sleep cycles, circadian rhythms, alertness and other non-visual responses. The safety of LED (solid-state) lighting with regard to human health has been the subject of recent scrutiny. There is growing concern that artificial light disrupts the normal regulation of human physiology and psychology, such as hormone synthesis, sleep-wake cycle, and level of alertness. In particular, recent evidence indicates that high color temperature (5000K) and high Illuminance light, such as for example light generated by LEDs, suppress pre-sleep melatonin secretion as well as reduce subjective alertness. It has also been reported that blue light has a greater tendency than other colors to affect living organisms through the disruption of their biological processes which rely upon natural cycles (circadian) of daylight and darkness. It is believed that exposure to blue light late in the evening and at night can be detrimental to health.

Various metrics have been proposed for predicting the melatonin suppression effect. Two of the more common metrics for measuring circadian stimulus are (i) Circadian Action Factor (CAF) and (ii) Melanopic Response (MR). CAF and MR are the ratio of the circadian luminous efficacy of radiation (CER) to luminous efficacy of radiation (LER) and each provide a measure of the brain's sensitivity to light, that is, a measure of human non-visual sensitivity to light. CAF is based on studies that measure human melatonin levels before and after exposure to specific wavelengths of light to establish a Circadian Action Spectrum (CAS) or circadian sensitivity spectrum $c(\lambda)$. CAF, denoted $a_{cv}$, is the ratio of the circadian efficacy to luminous efficacy of radiation. MR is based on the absorption spectrum of the melanopsin photopigment found in mammalian ipRGCs (intrinsically photosensitive Retinal Ganglion Cells) to establish a melanopic response (sensitivity) spectrum $m(\lambda)$. MR is the ratio of the circadian efficacy to luminous efficacy of radiation. Recently, a new metric Equivalent Melanopic Lux (EML) has been proposed that is weighted to the spectral response of the ipRGCs.

A further potential concern with LED lighting is the possibility of photoretinitis—photochemical damage to the retina—which can result from over exposure to violet to blue light. This is known as Blue Light Hazard (BLH) and similar to CAF and MR it has a corresponding blue sensitivity spectrum $b(\lambda)$. The risk of BLH is sometimes associated with LEDs, even though LEDs that emit white light do not contain significantly more blue than other types of source at the same color temperature. That said, BLH is a potential eye heath concern for high CCT (≥5000K) white LEDs since the blue peak generated by the LED is extremely high within the CAF and MR wavelength regions of the spectrum. According to current international standards, no light source that emits white light and is used in general lighting applications is considered hazardous to the retina for healthy adults. That said, the optical safety of specialty lamps or colored sources must be considered on a case-by-case basis, and light sources used around susceptible populations, such as infants or adults with certain types of eye disease, require additional evaluation.

Currently in the LED lighting industry, full spectrum white LEDs strive to generate white light with a General CRI Ra equal to 100 such as is exhibited by incandescent lamps and black body radiation. Such LEDs, however, are found to sacrifice efficacy by as much as 30% compared with white LEDs that generates light with a General CRI Ra of about 80 (CRI80).

The present invention arose in an endeavor to overcome at least in part the shortcomings of known solid-state white light emitting devices and provide human centric full spectrum white light emitting devices with an efficacy at least approaching or exceeding that of current CRI80 devices.

SUMMARY OF THE INVENTION

The invention concerns white light emitting devices for generating white light having an intensity wavelength spectrum (spectral content) that resembles natural sunlight from the blue to red wavelength region of the spectrum as closely as possible.

In particular, although not exclusively, at least some embodiments of the invention are directed to white light emitting devices whose light intensity at wavelengths corresponding to the red region of the spectrum have been optimized to improve efficacy. In such embodiments, white light emitting devices can comprise a narrowband red photoluminescence material, for example a phosphor, with an emission peak having a full width at half maximum (FWHM) emission intensity of the main peak emission that is less than about 30 nm. The emission peak wavelength is selected such as to reduce light intensity (photon count) at wavelengths corresponding the red region (range) of the wavelength spectrum for wavelengths longer than about 650 nm, at which the photopic response of the eye (i.e. photopic luminosity function) is generally low (about 0.1). The emission peak wavelength can be in a range from about 620 nm to about 640 nm. Due to the sharp drop-off in photoluminescence intensity of a narrowband red photoluminescence material compared with a broadband red photoluminescence (FWHM>75 nm) this reduces the light intensity in the red wavelength region of the spectrum for wavelengths longer than about 650 nm thereby improving efficacy while still closely resembling the natural light spectrum over the region of the spectrum from about 430 nm to about 650 nm, which can be detected by the eye.

Embodiments of the invention further concern white light emitting devices for generating white light that additionally closely resembles natural light in the blue to cyan region of the spectrum. According to embodiments of the invention, such white light emitting devices generate full spectrum white light that closely resembles natural light in the blue to cyan (430 nm to 520 nm) region where human non-visual perception measured by Circadian Action Factor (CAF) and Melanopic Response (MR) is affected most. White light having such a spectral characteristic is believed to be beneficial to human wellbeing since this part of the wavelength spectrum impacts melatonin secretion which can influence the circadian cycle. Such white light emitting devices utilize broadband solid-state excitation sources, for example blue LEDs, which generate broadband excitation light with a dominant wavelength in a range from about 420 nm to about 480 nm (that is in the blue region of the visible spectrum). In this patent specification "broadband" is used to denote light that has a FWHM (Full Width at Half Maximum) of at least 25 nm, preferably at least 30 nm; or may be used to denote blue light that is composed of a combination of at least two different wavelength blue light emissions in a wavelength range from about 420 nm to about 480 nm. Use of broadband blue excitation light enables the light emitting device to generate full spectrum light that closely resembles natural light in the blue to cyan (430 nm to 520 nm) region of the spectrum.

In an aspect of the present invention, there is provided a full spectrum white light emitting device comprising: a broadband solid-state excitation source for generating broadband excitation light with a dominant wavelength from about 420 nm to about 480 nm and a full width at half maximum intensity greater than about 25 nm; and a narrowband red photoluminescence material with an emission peak wavelength from about 620 nm to about 640 nm and a full width at half maximum emission intensity of less than about 30 nm; wherein the device has an efficacy of at least 130 lm/W and generates white light with a CRI Ra≥90, and wherein over a wavelength range from about 430 nm to about 520 nm, a maximum percentage intensity deviation of the white light from the intensity of light of a black-body curve or CIE Standard Illuminant D of the same Correlated Color Temperature is less than about 50%.

It may be that the light generated by the device has a Correlated Color Temperature from about 1800K to about 6800K.

The light generated by the device may have a Correlated Color Temperature from about 3200K to about 6800K.

In embodiments, the narrowband red photoluminescence material may comprise a phosphor material, quantum dot (QD) material or combinations thereof. It may be that the narrowband red photoluminescence material comprises a manganese-activated fluoride phosphor such as $K_2SiF_6$:$Mn^{4+}$, $K_2TiF_6$:$Mn^{4+}$ or $K_2GeF_6$:$Mn^{4+}$.

The device may be one of a surface mountable device, chip on board device, or a filament.

The light generated by the device may have a color rendering CRI R9 of at least 50.

The light generated by the device may have a color rendering CRI R1 to CRI R15 of at least 90.

It may be that light generated by the device has a color rendering CRI R1 to CRI R8 and CRI R10 to CRI R15 of at least 80.

The light generated by the device may have an IEC TM-30 Gamut Index $R_g$ of at least 98 and an IEC TM-30 Fidelity Index $R_f$ of at least 90.

The light generated by the device may have an IEC TM-30 local color fidelity $R_{f,hj}$ for hue angle-bins h1 to h12 and h13 to h16 of at least 90 and h13 of at least 85.

It may be that the light generated by the device has a Circadian Action Factor that is within 20% or 10% of the black-body curve or CIE Standard Illuminant D of the same color temperature.

The light emitting device may further comprise a green to yellow photoluminescence material with a peak emission wavelength in a range from 495 nm to 580 nm.

The light emitting device may further comprise an orange red photoluminescence material with a peak emission wavelength in a range from 580 nm to 625 nm.

It may be that the broadband excitation light comprises at least two blue light emissions.

The broadband solid-state excitation source may comprise: a first solid-state light source for generating the first blue light emission with a first dominant wavelength from 420 nm to 480 nm; and a second solid-state light source for generating the second different blue light emission with a second dominant wavelength from 420 nm to 480 nm.

It may be that the broadband solid-state excitation source comprises an LED with at least two different quantum wells that each generate a respective one of the at least two different wavelength blue light emissions.

The maximum percentage intensity deviation of white light generated by the device from the intensity of light of a black-body curve or CIE Standard Illuminant D of the same Correlated Color Temperature may be less than at least one of 40%, 30%, 20% and 15%.

In embodiments of the invention, there is encompassed a full spectrum white light emitting device comprising: a broadband solid-state excitation source for generating broadband excitation light with a dominant wavelength from about 420 nm to about 480 nm and a full width at half maximum intensity greater than about 25 nm; and a narrowband red photoluminescence material with an emission peak wavelength from about 620 nm to about 640 nm and a full width at half maximum emission intensity less than about 30 nm; wherein the device generates white light with a Circadian Action Factor that is within 20% or 10% of the black-body curve or CIE Standard Illuminant D of the same color temperature. Such embodiments can further one or more and combination thereof of the features hereinbefore described.

In embodiments of the invention, there is envisaged a full spectrum white light emitting device comprising: a broadband solid-state excitation source for generating broadband excitation light with a dominant wavelength from about 420 nm to about 480 nm and a full width at half maximum intensity greater than about 25 nm; and a narrowband red photoluminescence material; wherein the device generates a white light spectrum having a tail in the orange to red wavelength region whose relative intensity to that of the black-body curve or CIE Standard Illuminant D of the same Correlated Color Temperature decreases to 25% at a wavelength from about 635 nm to about 675 nm.

It may be that the device generates white light having a tail in the orange to red region whose relative intensity to that of the black-body curve or CIE Standard Illuminant D of the same Correlated Color Temperature decreases to 25% at a wavelength from about 645 nm to about 665 nm.

In embodiments, when the narrowband red photoluminescence material comprises a narrowband manganese-activated fluoride phosphor, the device may generate white light having a tail in the orange to red region whose relative intensity to that of the black-body curve or CIE Standard Illuminant D of the same Correlated Color Temperature decreases to 25% at a wavelength of about 655 nm.

Various embodiments can further one or more and combination thereof of the features hereinbefore described.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 6a and 6b are schematic cross-sectional C-C and partial cutaway plan views of an LED-filament white light emitting device according to some embodiments for use in the lamp of FIG. 5.

DETAILED DESCRIPTION OF THE INVENTION

Figure 1A:
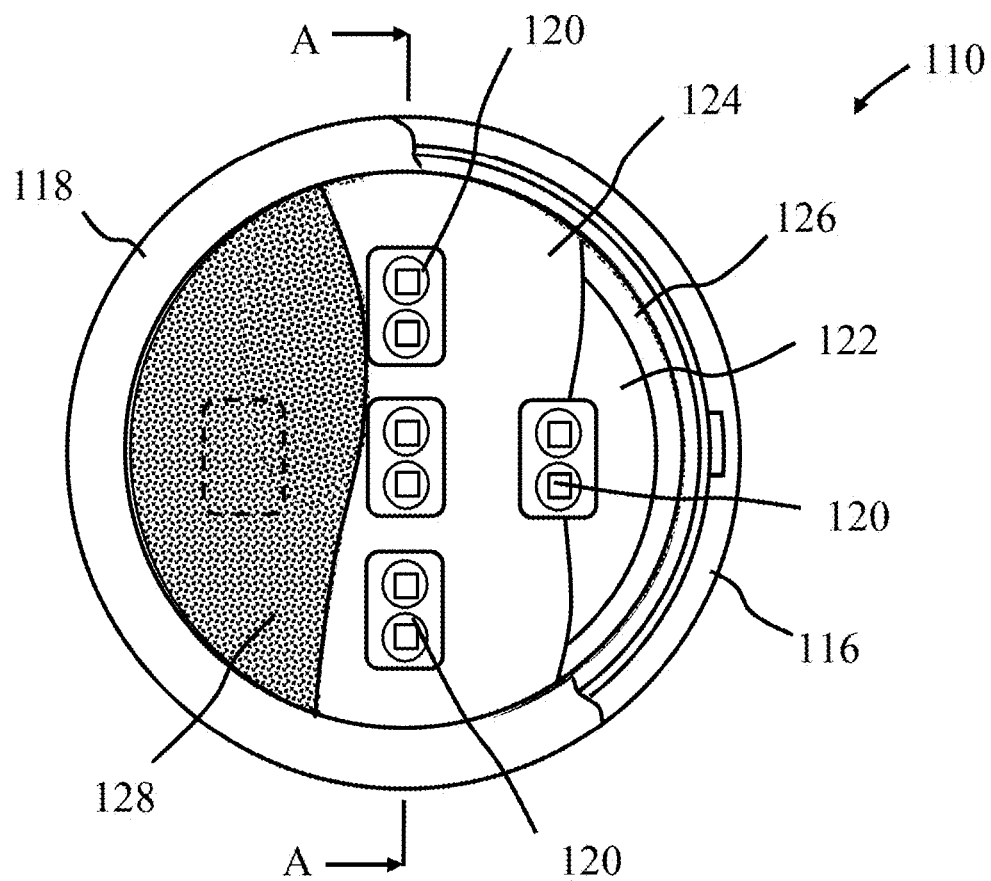
FIGS. 1a and 1b show a remote phosphor white light emitting device, according to some embodiments.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Throughout this specification, like reference numerals preceded by the figure number are used to denote like features.

Embodiments of the invention concern white light emitting devices that comprise a broadband solid-state excitation source, for example one or more LEDs, that is/are operable to generate broadband blue excitation light with a dominant wavelength in a range from 420 nm to 480 nm. In this patent specification, "broadband" blue light is used to denote blue light that has a FWHM (Full Width at Half Maximum) of at least 25 nm, preferably at least 30 nm; or may be used to denote blue light that is composed of a combination of at least two different wavelength blue light emissions in a wavelength range from 420 nm to 480 nm. Use of a broadband excitation source enables white light emitting devices to generate white light that closely resembles natural light in the blue to cyan region of the visible spectrum (about 430 nm to about 520 nm). Moreover, as described herein embodiments of the invention concern white light emitting devices that include a narrowband red photoluminescence material to improve efficacy.

Remote Phosphor White Light Emitting Devices

Figure 1B:
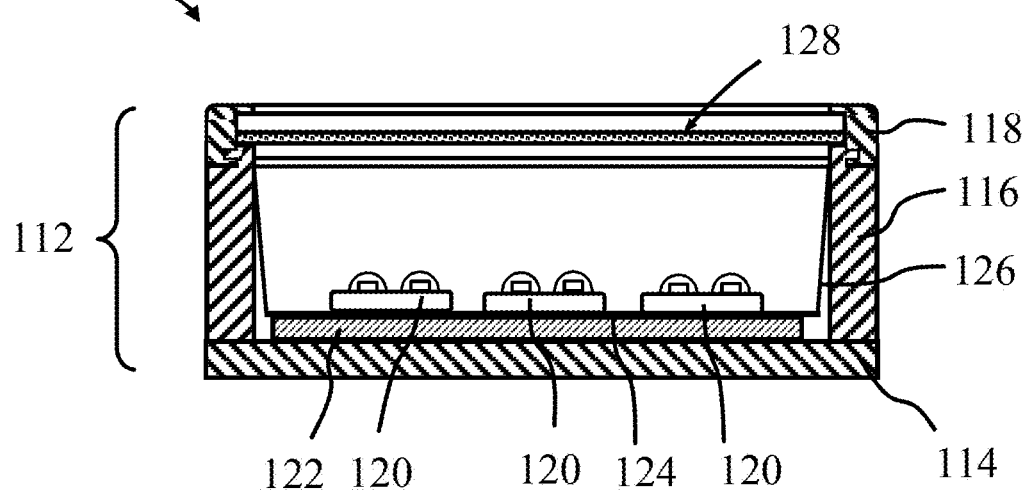

FIGS. 1a and 1b illustrate a remote phosphor solid-state white light emitting device according to an embodiment of the invention in which FIG. 1a is a partial cross-sectional plan view and FIG. 1b is a sectional side view through A-A. The device 110 can be configured to generate full spectrum white light with a CCT (Correlated Color Temperature) of between 1800K and 6800K. The device can be used alone or comprise a part of a downlight or other lighting arrangement. The device 110 comprises a hollow cylindrical body 112 composed of a circular disc-shaped base 114, a hollow cylindrical wall portion 116 and an annular top 118. To aid in the dissipation of heat, the base 114 can be fabricated from aluminum, an alloy of aluminum or any material with a high thermal conductivity. The base 114 can be attached to the wall portion 116 by screws or bolts or by other fasteners or by means of an adhesive.

Figure 2A:
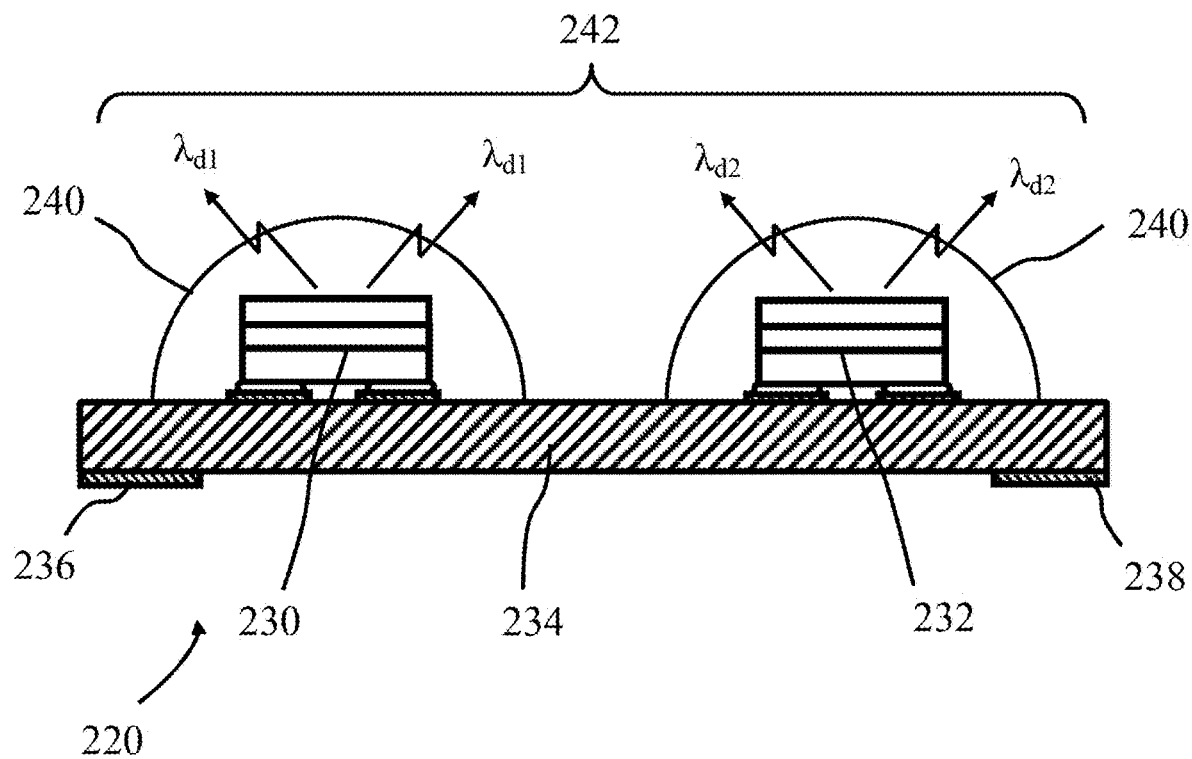
FIG. 2a is a schematic of a broadband blue solid-state excitation source in accordance with an embodiment of the invention for use in white light emitting device of FIGS. 1a and 1b.
Figure 2B:
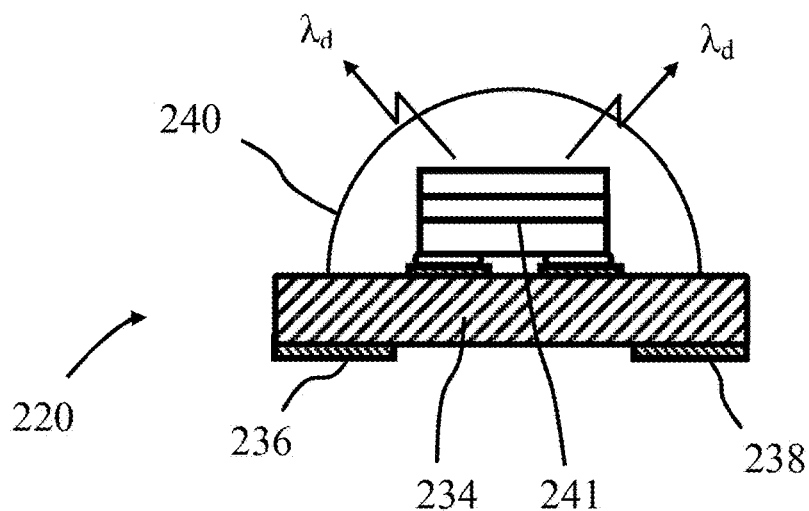
FIG. 2b is a schematic of a broadband blue solid-state excitation source in accordance with an another embodiment of the invention for use in the white light emitting device of FIGS. 1a and 1b.

The device 110 further comprises a plurality (five in the example of FIGS. 1a and 1b) of broadband blue solid-state excitation sources 120 that are mounted in thermal communication with a circular-shaped MCPCB (metal core printed circuit board) 122. Various broadband blue solid-state excitation sources 120 in accordance with embodiments of the invention are illustrated in FIGS. 2a and 2b. To maximize the emission of light, the device 10 can further comprise light reflective surfaces 124 and 126 that respectively cover the face of the MCPCB 122 and the inner curved surface of the cylindrical wall 116.

The device 110 further comprises a photoluminescence wavelength conversion component 128 that is located remotely to the excitation sources 120 and configured to absorb a portion of the excitation light generated by the excitation sources 120 and convert it to light of a different wavelength by a process of photoluminescence. The emission product of the device 110 comprises the combined light generated by the broadband blue excitation sources 120 and photoluminescence light generated by the photoluminescence wavelength conversion component 128. The photoluminescence wavelength conversion component can include a mixture of a narrowband red photoluminescence material, a green to yellow photoluminescence material and may further include a broadband orange to red photoluminescence material. The photoluminescence materials can comprise phosphor materials. Examples of narrowband red, green to yellow and orange to red photoluminescence materials are described below. The photoluminescence wavelength conversion component may be formed of a light transmissive material (for example, polycarbonate, acrylic material, silicone material, etc.) that incorporates a mixture of the photoluminescence materials. Furthermore, in embodiments, the photoluminescence wavelength conversion component may be formed of a light transmissive substrate that is coated with phosphor materials in one or more layers. The wavelength conversion component 128 is positioned remotely to the excitation sources 120 and is spatially separated from the excitation sources. In this patent specification, "remotely" and "remote" means in a spaced or separated relationship. Typically, wavelength conversion component and excitation sources are separated by an air, while in other embodiments they can be separated by a suitable light transmissive medium, such as for example a light transmissive silicone or epoxy material. The wavelength conversion component 128 is configured to completely cover the housing opening such that all light emitted by the lamp passes through the wavelength component 128. As shown, the wavelength conversion component 128 can be detachably mounted to the top of the wall portion 116 using the top 118 enabling the component and emission color of the lamp to be readily changed.

FIG. 2a is a schematic representation of a broadband blue solid-state excitation source 220, according to an embodiment of the invention. The broadband blue solid-state excitation source 220 is configured to generate broadband blue excitation light with a dominant wavelength from 420 nm to 480 nm; that is, in the blue region of the visible spectrum. In this embodiment, it also has a FWHM from 25 nm to 50 nm. In accordance with an embodiment of the invention, the broadband blue solid-state excitation source 220 comprises a first solid-state light source 230 and a second solid-state light source 232, which in this example are narrowband blue LED chips (e.g. blue-emitting GaN-based LED chips). The first solid-state light source 230 generates a blue light emission having a first dominant wavelength $\lambda_{d1}$ from 420 nm to 480 nm and the second solid-state light source 232 generates a blue light emission having a second dominant wavelength $\lambda_{d2}$ from 420 nm to 480 nm. The first and second solid-state light sources are selected such that the dominant wavelengths of light generated by the sources are different (i.e. $\lambda_{d1}$ is different to $\lambda_{d2}$). The combination of light from the first and second solid-state light sources 230/232 constitutes the broadband blue excitation light output 242 of the broadband blue solid-state excitation source 220 and has a dominant wavelength from 420 nm to 480 nm and has a FWHM from 25 nm to 50 nm. It will be understood that in other embodiments the solid-state excitation source may comprise a single solid-state light source. In this specification, a single solid-state light source is defined as one or more solid-state light sources each of which generates light with the same (i.e. single/solitary) dominant wavelength and with a FWHM of at least 25 nm.

As indicated in FIG. 2a, the broadband blue solid-state excitation source 220 can comprise a surface mountable device (SMD), such as for example an SMD 2835 LED package, in which the first and second solid-state light sources are flip-chip bonded on a top face of a substrate 234. Electrical contacts 236, 238 can be provided on the bottom face of the substrate 234 for operating the excitation source. The first and second solid-state light sources 230, 232 can be encapsulated with a light transmissive optical encapsulant 240, such as for example a silicone or epoxy material.

FIG. 2b is a schematic representation of a broadband blue solid-state excitation source 220, according to an embodiment of the invention. The solid-state excitation source 220 is configured to generate excitation light with a dominant wavelength from 420 nm to 480 nm, that is, in the blue region of the visible spectrum. In this embodiment, it also has a FWHM from 25 nm to 50 nm. In accordance with an embodiment of the invention, the solid-state excitation source 220 comprises a broadband solid-state light source 241, which in this example is a single broadband LED such as for example an InGaN/GaN blue LED having an active region with multiple-quantum-wells (MQWs), as disclosed in Appl. Phys. lett. 75, 1494 (1999) Tran C A et al. entitled *"Growth of InGaN multiple-quantum-well blue light-emitting diodes on silicone by metal organic vapor phase epitaxy"*. The broadband solid-state light source 241 generates broadband blue light comprising multiple overlapping blue light emissions of peak wavelengths in a range from 420 nm to 480 nm. Thus, the single solid-state light source 241 generates light with a single/solitary dominant wavelength and with a FWHM of at least 25 nm.

As indicated in FIG. 2b, the solid-state excitation source 220 can comprise a surface mountable device (SMD), such as for example an SMD 2835 LED package, in which the solid-state light source is flip-chip bonded on a top face of a substrate 234. Electrical contacts 236, 238 can be provided on the bottom face of the substrate 234 for operating the excitation source. The solid-state light source 241 can be encapsulated with a light transmissive optical encapsulant 240, such as for example a silicone or epoxy material.

Packaged White Light Emitting Devices

Figure 3A:
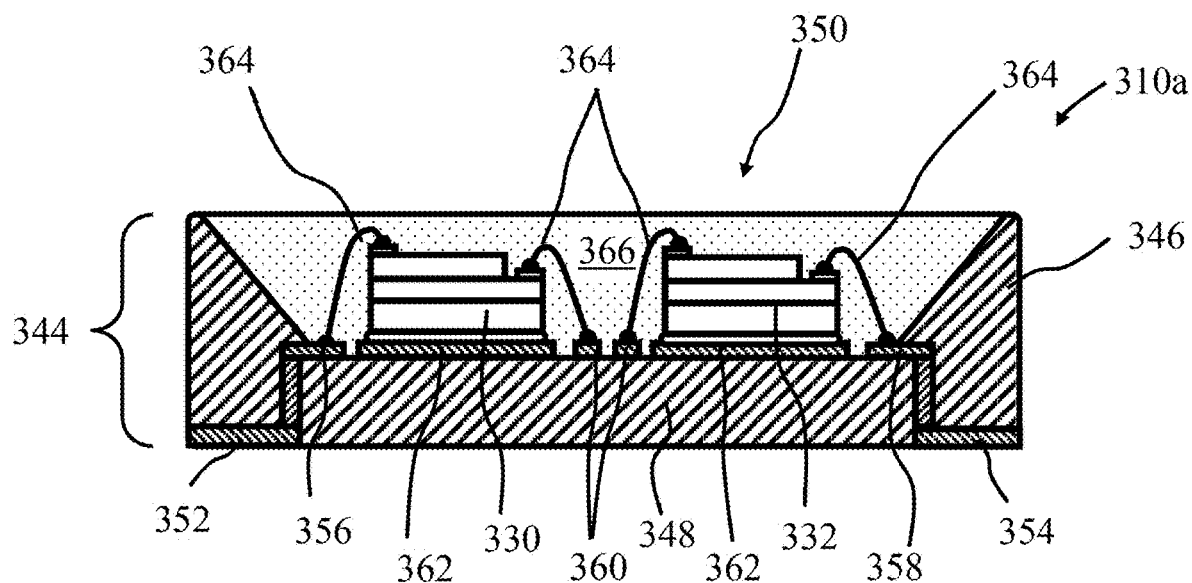
FIG. 3a is a schematic cross-sectional view of a packaged white light emitting device, according to some embodiments.

FIG. 3a is a schematic cross-sectional representation of a packaged white light emitting device 310a, according to an embodiment of the invention. The device 310a can be configured to generate full spectrum white light with a CCT (Correlated Color Temperature) of in a range from 1800 K to 6800K.

In accordance with embodiments of the invention, the device 310a comprises a broadband blue solid-state excitation source constituted by first and second solid-state light sources 330, 332, for example blue-emitting GaN (gallium nitride)-based LED chips, that are housed within a package 344. In a similar/same manner as described above, the first solid-state light source 330 can generate a blue light emission having a first dominant wavelength $\lambda_{d1}$ in a range from 420 nm to 480 nm and the second solid-state light source 332 can generate a blue light emission having a second dominant wavelength $\lambda_{d2}$ in a range from 420 nm to 480 nm. The dominant wavelength $\lambda_{d1}$ of the first solid-state light source is different from the dominant wavelength $\lambda_{d2}$ of the second solid-state light source. The package, which can for example comprise Surface Mountable Device (SMD) such as an SMD 2835 LED package, comprising upper portion 346 and base portion 348. The upper body part 346 defines a recess 350 which is configured to receive the solid-state light sources 330, 332. The package 344 can further comprise electrical connectors 352 and 354 on an exterior face of the base of the package 344. The electrical connectors 352, 354 can be electrically connected to electrode contact pads 356, 358 and 360 on the floor of the recess 350. Using adhesive or solder, the solid-state light sources (LED chips) 330, 332 can be mounted to a thermally conductive pad 362 located on the floor of the recess 350. The LED chip's electrode pads can be electrically connected to corresponding electrode contact pads 356, 358 and 360 on the floor of the package 344 using bond wires 362. Alternatively, the LED chips can be flip-chip mounted in and electrically connected to the package. The recess 350 is filled with a light transmissive optical encapsulant 364, typically an optically clear silicone, which is loaded with a mixture of photoluminescence materials (narrowband red photoluminescence material, green to yellow photoluminescence materials and optionally orange to red broadband photoluminescence materials) such that the exposed surfaces of the LED chips 330, 332 are covered by the photoluminescence/silicone material mixture. To enhance the emission brightness of the device the walls of the recess 350 can be inclined and have a light reflective surface. Of course, it will be understood that in other embodiments the one or more solid-state light sources (LED chips 330, 332) each generate light with the same (i.e. single/solitary) dominant wavelength and with a FWHM of at least 25 nm.

Figure 3B:
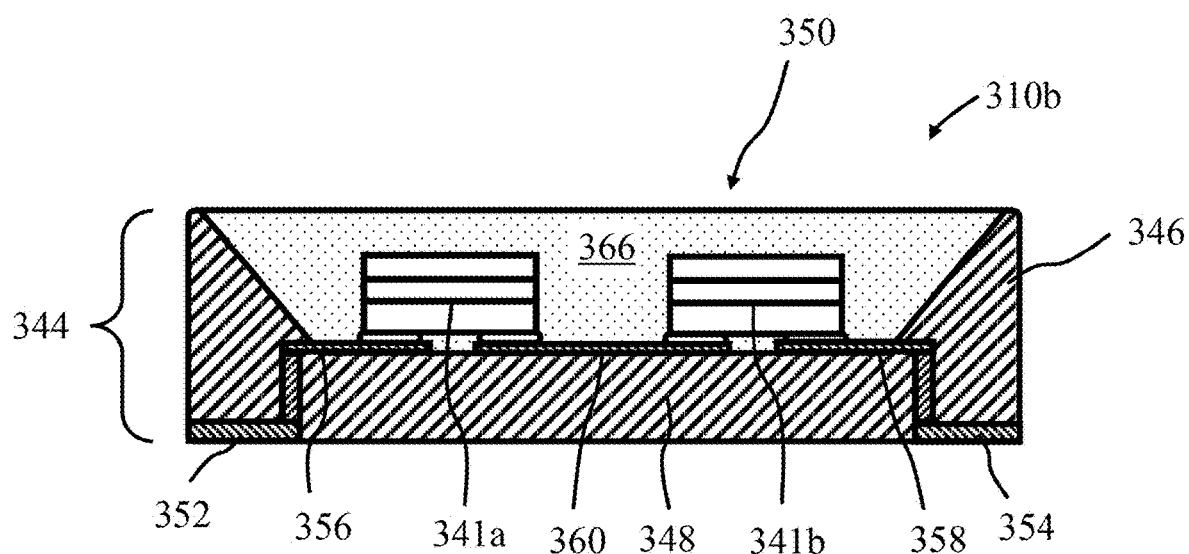
FIG. 3b is a schematic cross-sectional view of a packaged white light emitting device, according to some embodiments.

FIG. 3b is another embodiment of the present invention. It is similar to FIG. 3a except that the first and second narrowband solid-state light sources are replaced by two broadband blue LEDs 341a/341b having an active region with multiple-quantum-wells. Typically, the first and second broadband blue solid-state light sources 341a/341b each generate broadband blue excitation light having dominant wavelengths a which are the same.

Figure 4A:
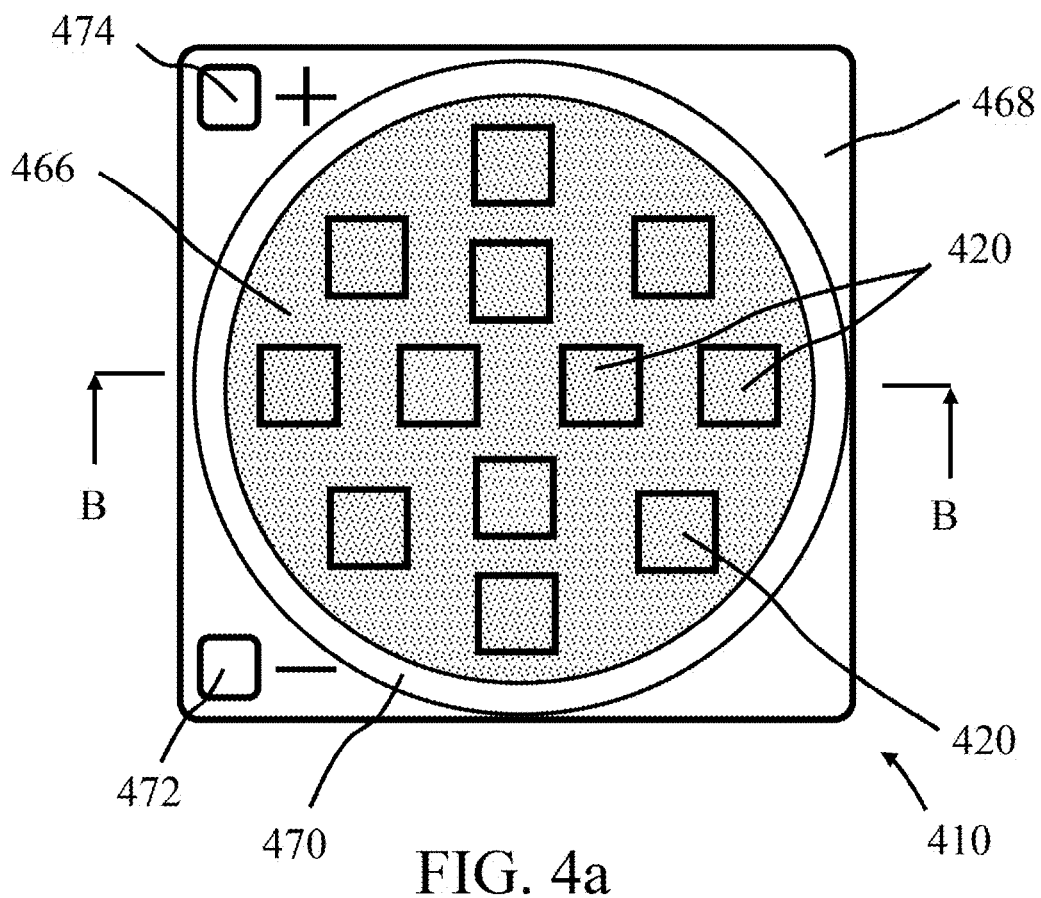
FIGS. 4a and 4b are schematic plan and cross-sectional B-B side views of a Chip On Board (COB) packaged white light emitting device, according to some embodiments.
Figure 4B:
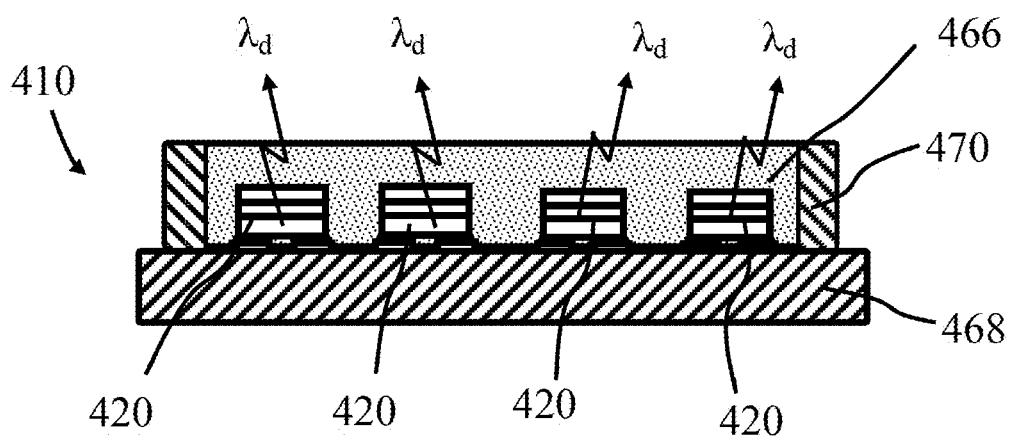

FIGS. 4a and 4b illustrate a Chip On Board (COB) packaged white light emitting device 410 according to an embodiment of the invention in which FIG. 4a is a plan view and FIG. 4b is a sectional view through B-B. The device 410 can be configured to generate warm white light with a CCT (Correlated Color Temperature) from 1800K to 6800K and a General Color Rendering Index (CRI Ra) of 95 or higher.

The device 410 comprises a plurality (twelve in the example of FIG. 4a) broadband blue solid-state excitation sources 420, for example broadband blue-emitting GaN (gallium nitride)-based LED flip-chip dies, mounted in thermal communication with a square-shaped MCPCB 468.

As indicated in FIG. 4a, the excitation sources 420 can be configured as a generally circular array. The solid-state excitation sources (broadband LED dies) 420 can each generate excitation light having a dominant wavelength $\lambda_d$ in a range from 420 nm to 480 nm (more typically from 440 nm to 455 nm). In this embodiment, they have a FWHM (Full Width at Half Maximum) from 25 nm to 50 nm. Electrical contacts 472, 474 can be provided on the top face of the MCPCB 468 for operating the white light emitting device 410. As shown, the broadband LED flip-chip dies 420 are encapsulated with a light transmissive optical encapsulant 466, such as for example a silicone or epoxy material, which is loaded with a mixture of photoluminescence materials (narrowband red photoluminescence material, green to yellow photoluminescence materials and optionally orange to red broadband photoluminescence materials) such that the exposed surfaces of the LED dies 420 are covered by the photoluminescence/silicone material mixture. As shown, the light transmissive encapsulant/photoluminescence material mixture 466 can be contained within an annular-shaped wall 470. Of course, it will be understood that in other embodiments, the arrangement depicted in FIGS. 4a and 4b could comprise solid-state excitation sources 420 constituted by two or more LEDs rather than a single broadband InGaN/GaN blue LED having multiple-quantum-wells.

LED-Filament White Light Emitting Devices

Figure 5:
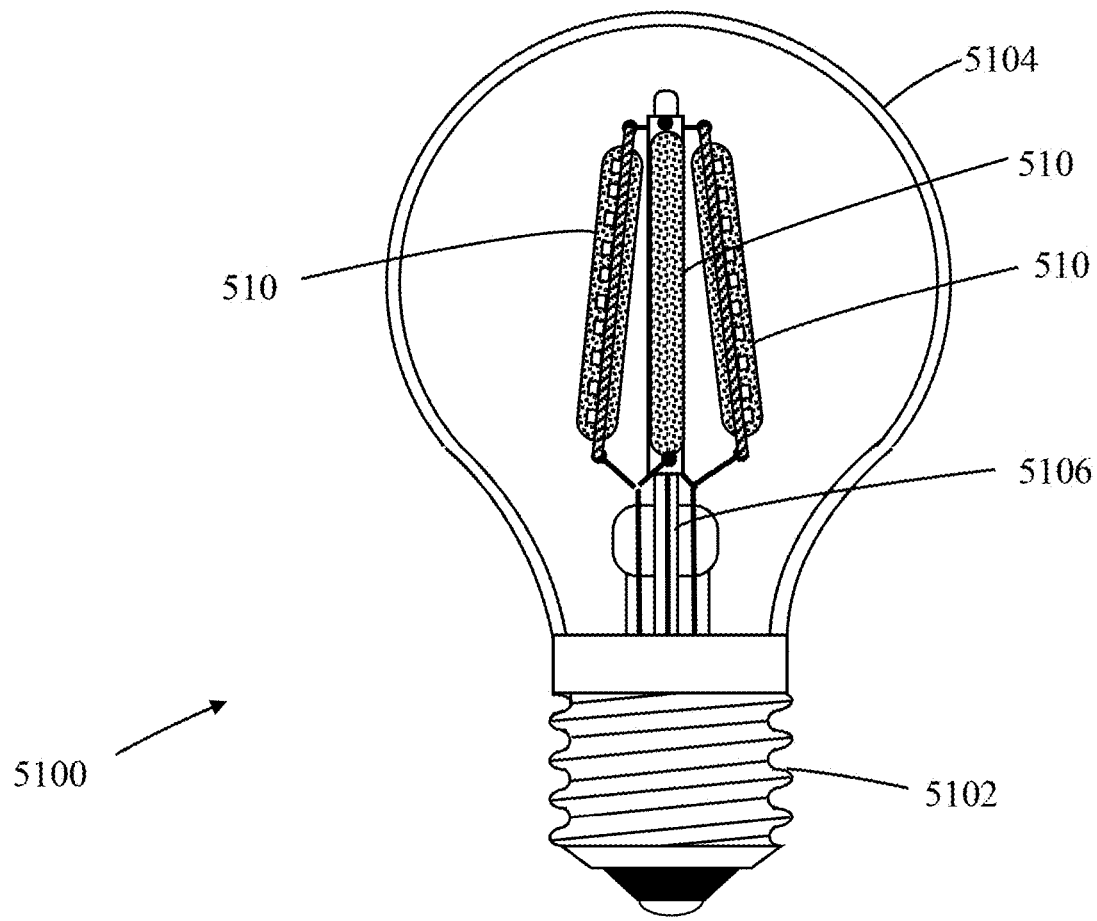
FIG. 5 is a side view of an LED-filament lamp in accordance according to some embodiments.

FIG. 5 illustrates a side view of an LED-filament A-Series lamp (bulb) 5100 for generating full spectrum white light with a CCT (Correlated Color Temperature) in a range 1800 K to 6800K. The LED-filament lamp 5100 comprises a connector base 5102, a light-transmissive glass envelope 5104; a glass LED-filament support (stem) 5106 and four LED-filaments (white light emitting devices) 510 in accordance with the invention.

An LED-filament 610 according to an embodiment of the invention is now described with reference to FIGS. 6a and 6b which shows a cross-sectional side view through C-C and a partial cut-away plan view of an LED-filament 610. The LED-filament 610 can comprise a circuit board (substrate) 6108 having an array of solid-state broadband excitation sources 620 mounted on a front face 6110. The broadband excitation sources are configured to generate broadband blue excitation light with a dominant wavelength $\lambda_d$ from 420 nm to 480 nm, that is, in the blue region of the visible spectrum with a FWHM in a range 25 nm to 50 nm. In the embodiment illustrated, the broadband excitation sources 620 are constituted by unpackaged broadband blue LED dies (for example MQW InGaN/GaN LED dies described herein) which are mounted directly to the substrate. In other embodiments, each of the broadband excitation sources 620 may be constituted by a combination of at least two individual narrowband blue LED dies having different respective dominant wavelengths $\lambda_{d1}$ $\lambda_{d2}$ which are mounted directly to the substrate.

In the embodiment, illustrated the substrate 6108 is planar and has an elongate form (strip) with the broadband excitation sources 620 being configured as a linear array along the length of the substrate.

Typically each LED-filament 620 can comprise twenty five excitation sources (LED dies) with a total nominal power of about 2 W.

The substrate 6108 which is preferably at least translucent can comprise any light-transmissive material with a transmittance to visible light of 10% or greater such as for example glass or a plastics material such as polypropylene, silicone or an acrylic. The substrate 6108 can on the front face 6110 further comprise electrically conductive tracks 6112 configured in a desired circuit configuration for electrically connecting the excitation sources 620. As illustrated the excitation sources 620 can be electrically connected serially as a string. As shown the excitation sources 620 can be electrically connected to the conducting tracks 6112 using bond wires 6114. In other embodiments, the excitation sources 620 can be directly connect to each other by means of bond wires thereby eliminating the need for the conducting tracks. In yet other embodiments, the excitation sources 620 can comprise surface mountable or flip-chip LEDs mounted to the conducting tracks. The substrate 6108 can, at respective ends, comprise electrodes 6116 for applying electrical power to the LED-filament 610.

In accordance with embodiments of the invention the LED-filament 620 further comprises a photoluminescence wavelength conversion material 666 covering at least the front face 6110 of the substrate and excitation sources 620. In accordance with embodiments of the invention the photoluminescence wavelength conversion material 666 comprises a combination narrowband red photoluminescence material and green to yellow photoluminescence materials. Optionally the photoluminescence wavelength conversion material 666 can further comprise orange to red broadband photoluminescence materials. To ensure that light emitted from front and rear faces of the LED-filament is substantially the same color, the LED-filament 620 may, as shown, further comprises a photoluminescence wavelength conversion material 6118 covering the back face 6120 of the substrate. The photoluminescence wavelength conversion material 6118 can comprise the same photoluminescence material as the photoluminescence wavelength conversion material 620.

Narrowband Red Photoluminescence Materials

As described herein, to improve efficacy, white light emitting devices in accordance with embodiments of the invention include a narrowband red photoluminescence material. In this patent specification, a narrowband red photoluminescence materials is defined as a photoluminescence material which generates light having a peak emission wavelength ($\lambda_{pe}$) from about 620 nm to about 640 nm; that is, in the orange to red region of the visible spectrum, and a FWHM emission intensity of less than about 30 nm. As described herein, use of such a narrowband red photoluminescence material reduces light intensity in the red wavelength region of the spectrum for wavelengths longer than about 650 nm, at which the photopic response of the eye is low (about 0.1). The emission peak wavelength can be in a range about 620 nm to about 640 nm. Due to the sharp drop-off in photoluminescence intensity of a narrowband red photoluminescence material compared with a broadband red photoluminescence (FWHM>75 nm), this reduces light intensity for wavelengths longer than about 650 nm at which the eye is insensitive, and it is understood by the inventors that this reduction in light intensity at such wavelengths improves device efficacy.

The narrowband red photoluminescence material can comprise phosphor materials and/or quantum dot (QD) materials.

Narrowband Red Phosphors: Manganese-Activated Fluoride Phosphors

Figure 7:
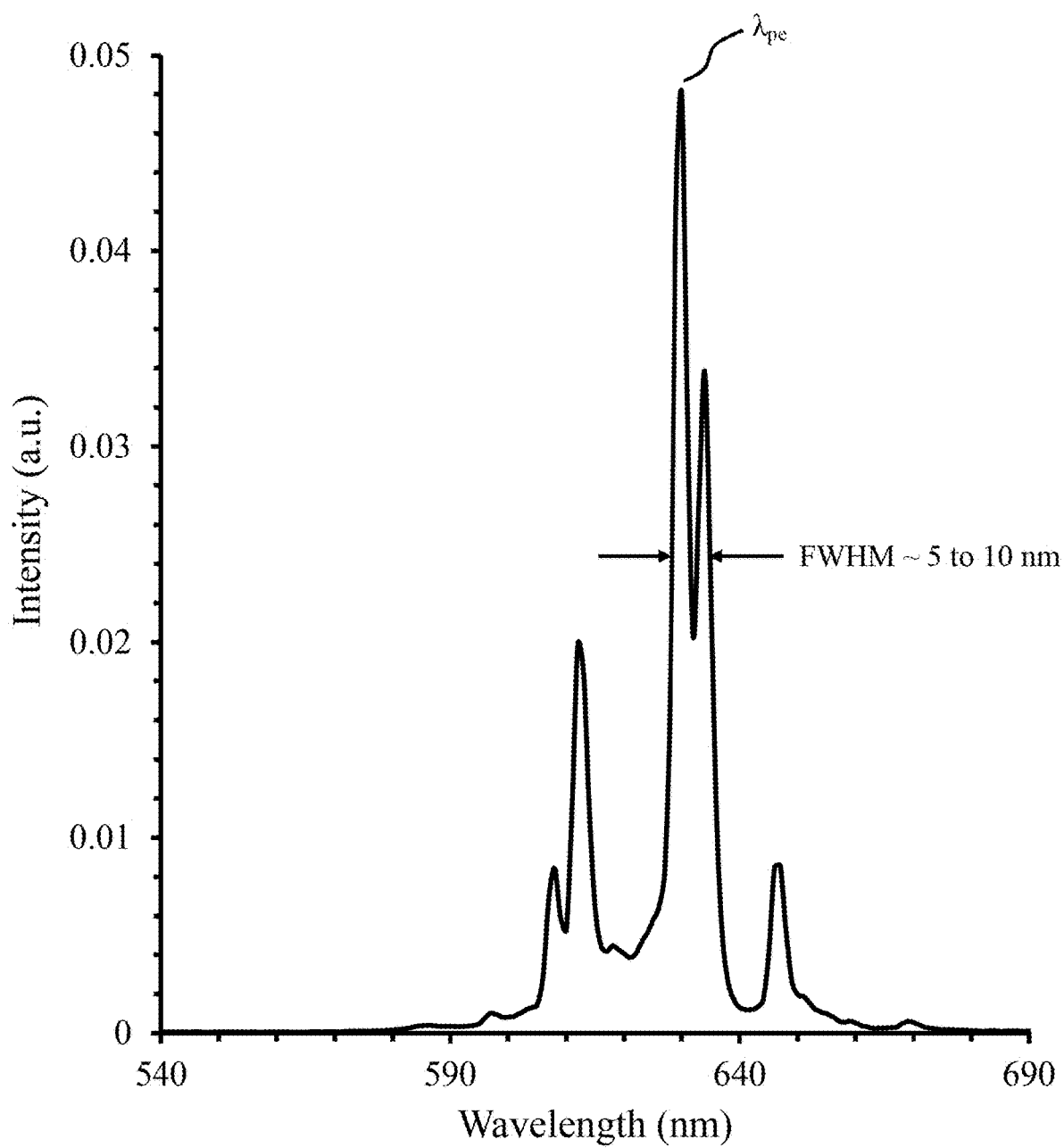
FIG. 7 shows the emission spectrum of manganese-activated potassium hexafluorosilicate phosphor (KSF) of general composition $K_2SiF_6:Mn^{4+}$.

An example of a narrowband manganese-activated fluoride phosphor is manganese-activated potassium hexafluorosilicate phosphor (KSF) of general composition $K_2SiF_6$:$Mn^{4+}$. An example of such a phosphor is NR6931 KSF phosphor from Intematix Corporation, Fremont Calif., USA which has a peak emission wavelength ($\lambda_{pe}$) of about 632 nm. FIG. 7 shows the emission spectrum of NR6931 KSF phosphor. KSF phosphor is excitable by blue excitation light and generates red light with a peak emission wavelength ($\lambda_{pe}$) of between about 631 nm and about 632 nm with a FWHM of ~5 nm to ~10 nm (depending on the way it is measured: i.e. whether the width takes account of a single or double peaks—FIG. 7). Other manganese-activated phosphors can include: $K_2GeF_6$:$Mn^{4+}$ (KGF), $K_2TiF_6$:$Mn^{4+}$ (KTF), $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, and $Rb_2TiF_6$:$Mn^{4+}$.

Narrowband Red Photoluminescence Materials: Red Guantum Dots (ODs)

A quantum dot (QD) is a portion of matter (e.g. semiconductor) whose excitons are confined in all three spatial dimensions that may be excited by radiation energy to emit light of a particular wavelength or range of wavelengths. The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). On the other hand, blue QDs, which are smaller in size can absorb and emit photons of a relatively higher energy (shorter wavelength).

The QD materials can comprise core/shell nano-crystals containing different materials in an onion-like structure. For example, the above-described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmium-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2/ZnS$, $CuInS_2/CdS$, $CuInS_2/CuGaS_2$, $CuInS_2/CuGaS_2/ZnS$ and so on.

QDs can comprise different materials and examples of red QD compositions are given in Table 1.

TABLE 1

Red Quantum dot composition

| | |
|---|---|
| CdSe ~4.2 nm | cadmium selenide |
| $Cd_xZn_{1-x}Se$ | cadmium zinc selenium |
| CdZnSeS | cadmium zinc selenium sulfide |
| $CdSe_xS_{1-x}$ | cadmium selenium sulfide |
| CdTe | cadmium telluride |
| $CdTe_xS_{1-x}$ | cadmium tellurium sulfide |
| InP | indium phosphide |
| $In_xGa_{1-x}P$ | indium gallium phosphide |
| InAs | indium arsenide |
| $CuInS_2$ | copper indium sulfide |
| $CuInSe_2$ | copper indium selenide |
| $CuInS_xSe_{2-x}$ | copper indium sulfur selenide |
| $Cu\,In_xGa_{1-x}S_2$ | copper indium gallium sulfide |
| $Cu\,In_xGa_{1-x}Se_2$ | copper indium gallium selenide |
| $CuGaS_2$ | copper gallium sulfide |
| $Cu\,In_xAl_{1-x}Se_2$ | copper indium aluminum selenide |
| $CuInS_{2x}ZnS_{1-x}$ | copper indium sulfur zinc sulfide |
| $CuInSe_{2x}ZnSe_{1-x}$ | copper indium selenium zinc selenide |

Green to Yellow Photoluminescence Materials

In this patent specification, a green to yellow photoluminescence material refers to a material which generates light having a peak emission wavelength ($\lambda_{pe}$) in a range from ~495 nm to ~580 nm, that is in the green to yellow/orange region of the visible spectrum. Preferably, the green to yellow photoluminescence material has a broad emission characteristic and preferably has a FWHM (Full Width at Half Maximum) of ~100 nm or wider. The green to yellow photoluminescence material can comprise any photoluminescence material, such as for example, garnet-based inorganic phosphor materials, silicate phosphor materials and oxynitride phosphor materials. Examples of suitable green to yellow phosphors are given in Table 2.

In some embodiments, the green to yellow photoluminescence materials comprises a cerium-activated yttrium aluminum garnet phosphor of general composition $Y_3(A,Ga)O_{12}:Ce$ (YAG) such as for example a YAG series phosphor from Intematix Corporation, Fremont Calif., USA which have a peak emission wavelength of in a range 527 nm to 543 nm and a FWHM of ~120 nm. In this patent specification, the notation YAG #represents the phosphor type—YAG-based phosphors—followed by the peak emission wavelength in nanometers (#). For example, YAG535 denotes a YAG phosphor with a peak emission wavelength of 535 nm. The green to yellow photoluminescence material may comprise a cerium-activated yttrium aluminum garnet phosphor of general composition $(Y,Ba)_3(Al,Ga)_5O_{12}:Ce$ (YAG) such as for example a GNYAG series phosphor from Intematix Corporation, Fremont Calif., USA. In some embodiments, the green photoluminescence material can comprise an aluminate (LuAG) phosphor of general composition $Lu_3Al_5O_{12}:Ce$ (GAL). Examples of such phosphors include for example the GAL series of phosphor from Intematix Corporation, Fremont Calif., USA which have a peak emission wavelength of 516 nm to 560 nm and a FWHM of ~120 nm. In this patent specification, the notation GAL #represents the phosphor type (GAL)—LuAG—based phosphors—followed by the peak emission wavelength in nanometers (#). For example, GAL520 denotes a GAL phosphor with a peak emission wavelength of 520 nm.

Examples of green to yellow silicate phosphors include europium activated ortho-silicate phosphors of general composition $(Ba, Sr)_2SiO_4$:Eu such as for example G, EG, Y and EY series of phosphors from Intematix Corporation, Fremont Calif., USA which have a peak emission wavelength in a range 507 nm to 570 nm and a FWHM of ~70 nm to ~80 nm.

In some embodiments, the green to yellow phosphor can comprise a green-emitting oxynitride phosphor as taught in U.S. Pat. No. 8,679,367 entitled "Green-Emitting (Oxy) Nitride-Based Phosphors and Light Emitting Devices Using the Same" which is hereby incorporated in its entirety. Such a green-emitting oxynitride (ON) phosphor can have a general composition $Eu^{2+}:M^{2+}Si_4AlO_xN_{(7-2x/3)}$ where $0.1 \leq x \leq 1.0$ and $M^{2+}$ is one or more divalent metal selected from the group consisting of Mg, Ca, Sr, Ba, and Zn. In this patent specification, the notation ON #represents the phosphor type (oxynitride) followed by the peak emission wavelength ($\lambda_{pe}$) in nanometers (#). For example ON495 denotes a green oxynitride phosphor with a peak emission wavelength of 495 nm.

TABLE 2

Example green to yellow photoluminescence materials

| Phosphor | General Composition | |
|---|---|---|
| YAG (YAG#) | $Y_{3-x}(Al_{1-y}Ga_y)_5O_{12}:Ce_x$ | $0.01 < x < 0.2$ and $0 < y < 2.5$ |
| GNYAG (YAG#) | $(Y,Ga)_{3-x}(Al_{1-y}Ga_y)_5O_{12}:Ce_x$ | $0.01 < x < 0.2$ and $0 < y < 2.5$ |
| LuAG (GAL#) | $Lu_{3-x}(Al_{1-y}M_y)_5O_{12}:Ce_x$ | $0.01 < x < 0.2$ and $0 < y < 1.5$ M = Mg, Ca, Sr, Ba, Ga, |
| LuAG (GAL#) | $Lu_{3-x}(Al_{1-y}Ga_y)_5O_{12}:Ce_x$ | $0.01 < x < 0.2$ and $0 < y < 1.5$ |
| Silicate | $A_2SiO_4$:Eu | A = Mg, Ca, Sr, Ba |
| Silicate | $(Sr_{1-x}Ba_x)_2SiO_4$:Eu | $0.3 < x < 0.9$ |

Orange to Red Photoluminescence Materials

In this patent specification, an orange to red photoluminescence material refers to a material which generates light having a peak emission wavelength ($\lambda_{pe}$) in a range from 580 nm to 670 nm, that is in the orange/yellow to red region of the visible spectrum. The orange to red photoluminescence material can comprise any orange to red photoluminescence material, typically a phosphor, that is excitable by blue light and can include, for example broadband red photoluminescence materials such as a europium-activated silicon nitride-based phosphor, α-SiAlON, Group IIA/B selenide sulfide-based phosphors or silicate-based phosphors. Examples of orange to red phosphors are given in Table 3.

In some embodiments, the europium activated silicon nitride-based phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$. In this patent specification, the notation CASN #represents the phosphor type (CASN) followed by the peak emission wavelength ($\lambda_{pe}$) in nanometers (#). For example CASN615 denotes an orange to red CASN phosphor with a peak emission wavelength of 615 nm.

In one embodiment, the orange to red phosphor can comprise an orange to red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$ wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/v$ and v is the valence of M.

Alternatively, the orange to red phosphor can comprise an orange to red emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and where the red-emitting phosphor has the general crystalline structure of $M'_2Si_5N_8$:RE, Al substitutes for Si within the general crystalline structure, and M is located within the general crystalline structure substantially at the interstitial sites. An example of one such a phosphor is XR610 red nitride phosphor from Intematix Corporation, Fremont Calif., USA which has a peak emission wavelength of 610 nm.

Orange to red phosphors can also include Group IIA/IIB selenide sulfide-based phosphors. A first example of a Group IIA/B selenide sulfide-based phosphor material has a composition $MSe_{1-x}S_x$:Eu, wherein M is at least one of Mg, Ca, Sr, Ba and Zn and $0 < x < 1.0$. A particular example of this phosphor material is CSS phosphor ($CaSe_{1-x}S_x$:Eu). Details of CSS phosphors are provided in co-pending United States patent application Publication Number US2017/0145309 filed 30 Sep. 2016, which is hereby incorporated by reference in its entirety. The CSS orange to red phosphors described in United States patent publication US2017/0145309 can be used in the present invention. The emission peak wavelength of the CSS phosphor can be tuned from 600 nm to 650 nm by altering the S/Se ratio in the composition and exhibits a narrowband red emission spectrum with FWHM in the range ~48 nm to ~60 nm (longer peak emission wavelength typically has a larger FWHM value). In this patent specification, the notation CSS #represents the phosphor type (CSS) followed by the peak emission wavelength in nanometers (#). For example CSS615 denotes a CSS phosphor with a peak emission wavelength of 615 nm. To improve reliability, the CSS phosphor particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition, the narrowband red phosphor particles may be coated with one or more fluorides, for example: calcium fluoride ($CaF_2$), magnesium fluoride ($MgF_2$), zinc fluoride ($ZnF_2$), aluminum fluoride ($AlF_3$) or titanium fluoride ($TiF_4$). The coatings may be a single layer, or multiple layers with combinations of the aforesaid coatings. The combination coatings may be coatings with an abrupt transition between the first and second materials, or may be coatings in which there is a gradual/smooth transition from the first material to the second material thus forming a zone with mixed composition that varies through the thickness of the coating.

In some embodiments, the orange to red phosphor can comprise an orange-emitting silicate-based phosphor as taught in U.S. Pat. No. 7,655,156 entitled "Silicate-Based Orange Phosphors" which is hereby incorporated in its entirety. Such an orange-emitting silicate-based phosphor can have a general composition $(Sr_{1-x}M_x)_yEu_zSiO_5$ where $0 < x \leq 0.5$, $2.6 \leq y \leq 3.3$, $0.001 \leq z \leq 0.5$ and M is one or more divalent metal selected from the group consisting of Ba, Mg, Ca, and Zn. In this patent specification, the notation O #represents the phosphor type (orange silicate) followed by the peak emission wavelength ($\lambda_{pe}$) in nanometers (#). For example, 0600 denotes an orange silicate phosphor with a peak emission wavelength of 600 nm.

TABLE 3

Example orange to red photoluminescence materials

| Phosphor | General Composition | |
|---|---|---|
| CASN (CASN#) | $(Ca_{1-x}Sr_x)AlSiN_3$:Eu | $0.5 < x \leq 1$ |
| 258 nitride | $Ba_{2-x}Sr_xSi_5N_8$:Eu | $0 \leq x \leq 2$ |
| | | M = Mg, Ca, Sr, Ba, Zn |
| Group IIA/IIB Selenide Sulfide (CSS#) | $MSe_{1-x}S_x$:Eu | $0 < x < 1.0$ |
| CSS (CSS#) | $CaSe_{1-x}S_x$:Eu | $0 < x < 1.0$ |
| | | M = Ba, Mg, Ca, Zn |
| | | $0 < x \leq 0.5$ |
| Silicate (O#) | $(Sr_{1-x}M_x)_yEu_zSiO_5$ | $2.6 \leq y \leq 3.3$ |
| | | $0.001 \leq z \leq 0.5$ |

1800K to 6800K White Light Emitting Devices

As described above, embodiments of the invention concern improving efficacy of white light emitting devices by the inclusion of a narrowband red photoluminescence material to reduce light intensity at wavelengths corresponding to the red part of the spectrum for wavelengths longer than about 650 nm. Embodiments of the invention can additionally concern white light emitting devices that generate white light that closely resembles natural light, in particular although not exclusively, in the in blue to cyan (430 nm to 520 nm) region of the visible spectrum where human non-visual perception, as for example, measured by CAF (Circadian Action Factor) and Melanopic Response (MR) are believed to be affected most.

Packaged White Light Emitting Device—Test Method

The packaged test method involves measuring total light emission of a packaged white light emitting device 310a (FIG. 3a) in an integrating sphere. The device is mounted on a temperature controlled plate and measurements made for operation of the device at temperatures of 25° C. (C-Cold) and 85° C. (H-Hot).

Packaged white light emitting devices in accordance with the invention each comprise a 2835-PCT (PolyCyclohexylene-dimethylene Terephthalate) SMD package (2.8 mm×3.5 mm) SMD package containing three 1133 (11 mil by 33 mm) LED chips.

Figure 8:
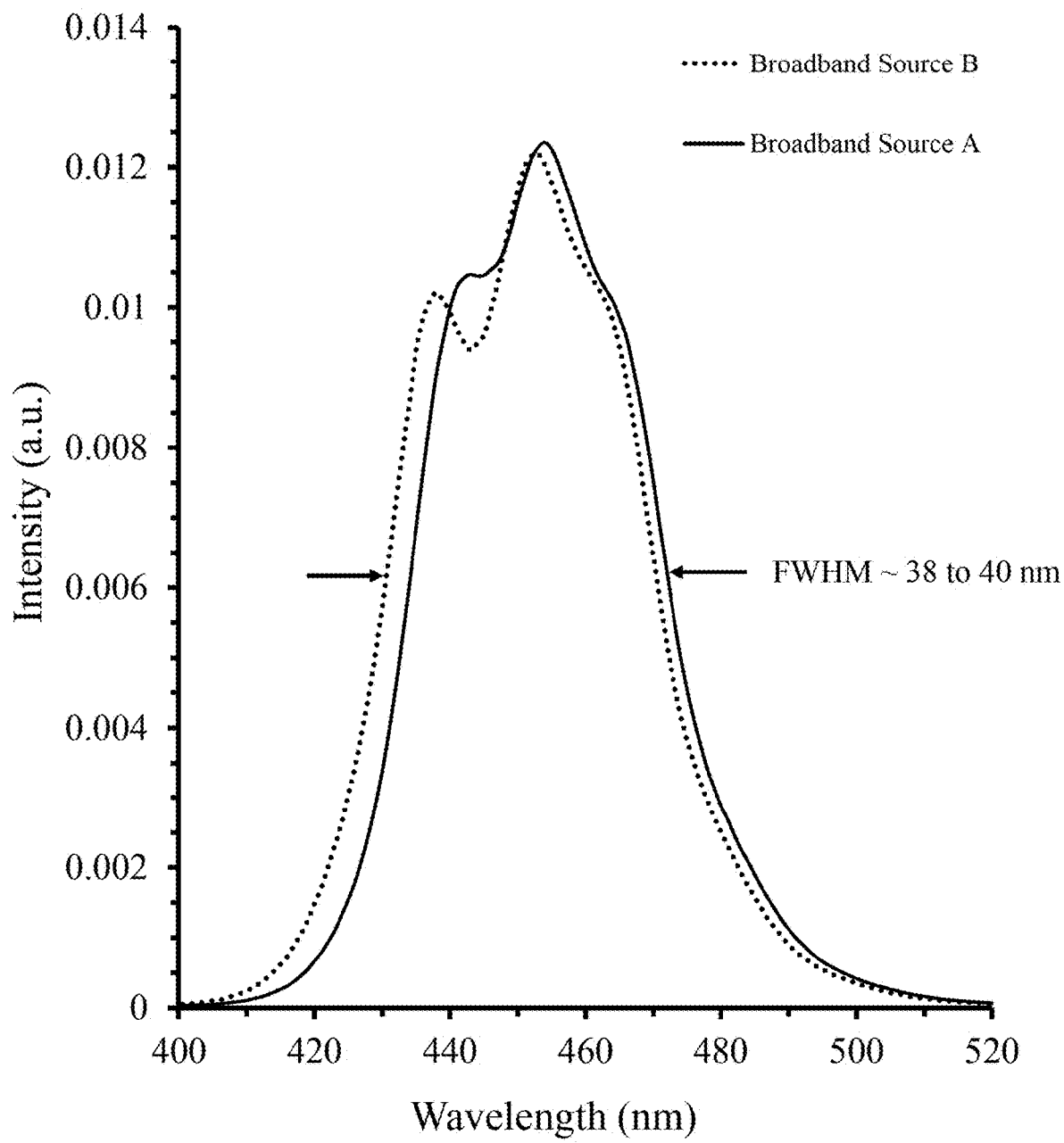
FIG. 8 shows emission spectra, intensity versus wavelength (nm) for: (i) a first broadband solid-state excitation source denoted "A" (solid line), and (ii) a second broadband solid-state excitation source denoted "B" (dotted line)

In this specification, the following nomenclature is used to denote white light emitting devices: Dev. #A denotes a white light emitting device in accordance with the invention comprising a first broadband solid-state excitation source denoted "A" comprising three LED chips of different dominant wavelengths ($\lambda_{d1A}$=441 nm, $\lambda_{d2A}$=456 nm and $\lambda_{d3A}$=469 nm); Dev. #B denotes a white light emitting device in accordance with the invention comprising a second broadband solid-state excitation source comprising three LED chips of dominant wavelengths ($\lambda_{d1B}$=446 nm, $\lambda_{d2B}$=456 nm and $\lambda_{d3B}$=469 nm); and Com. #denotes a comparative light emitting device in which each excitation source comprises one or more solid-state light sources (narrowband excitation source) of a single dominant wavelength $\lambda_d$. FIG. 8 are emission spectra, intensity versus wavelength (nm) for: (i) the first broadband solid-state excitation source denoted "A" (solid line), and (ii) the second broadband solid-state excitation source denoted "B" (dotted line). As can be seen from the figure, the combination of LED chips generates broadband blue excitation light having a FWHM of about 40 nm.

2700K Full Spectrum White Light Emitting Devices—Test Data

Tables 4, 5 and 6 tabulate measured optical test data for 2700K white light emitting devices Dev.1A and Dev.1B and a known 2700K CRI90 comparative device Com.1. Tables 7 and 8 tabulate measured IEC TM-30-15 optical test data for Dev.1B.

As described above, light emitting device Dev.1A comprises a 2835 SMD package containing three LED chips of dominant wavelength $\lambda_{d1A}$=441 nm, $\lambda_{d2A}$=456 nm and $\lambda_{d3A}$=469 nm while device Dev.1B comprises three LED chips of dominant wavelength $\lambda_{d1B}$=446 nm, $\lambda_{d2B}$=456 nm and $\lambda_{d3B}$=469 nm. Devs.1A and 1B each comprise the same combination of GAL520 ($Lu_{3-x}(Al_{1-y}Ga_y)_5O_{12}:Ce_x$, $\lambda_{pe}$=520 nm), GYAG543 (($Y,Ga)_{3-x}(Al_{1-y}Ga_y)_5O_{12}:Ce_x$, $\lambda_{pe}$=543 nm), CASN615 ($Ca_{1-x}Sr_xASiN_3$:Eu, $\lambda_{pe}$=615 nm, FWHM≈74 to 75 nm), and KSF ($K_2SiF_6:Mn^{4+}$, $\lambda_{pe}$=630 to 632 nm, FWHM≈5 to 10 nm) phosphors. Comparative device Com.1 comprises a known 2835 packaged white light emitting device which utilizes a narrowband excitation source and has a nominal CRI Ra of 90 while comparative device Com.2 comprises a 2835 packaged CRI Ra 90 white light emitting device which utilizes a narrowband excitation source and includes a narrowband red photoluminescence material (KSF).

Figure 9A:
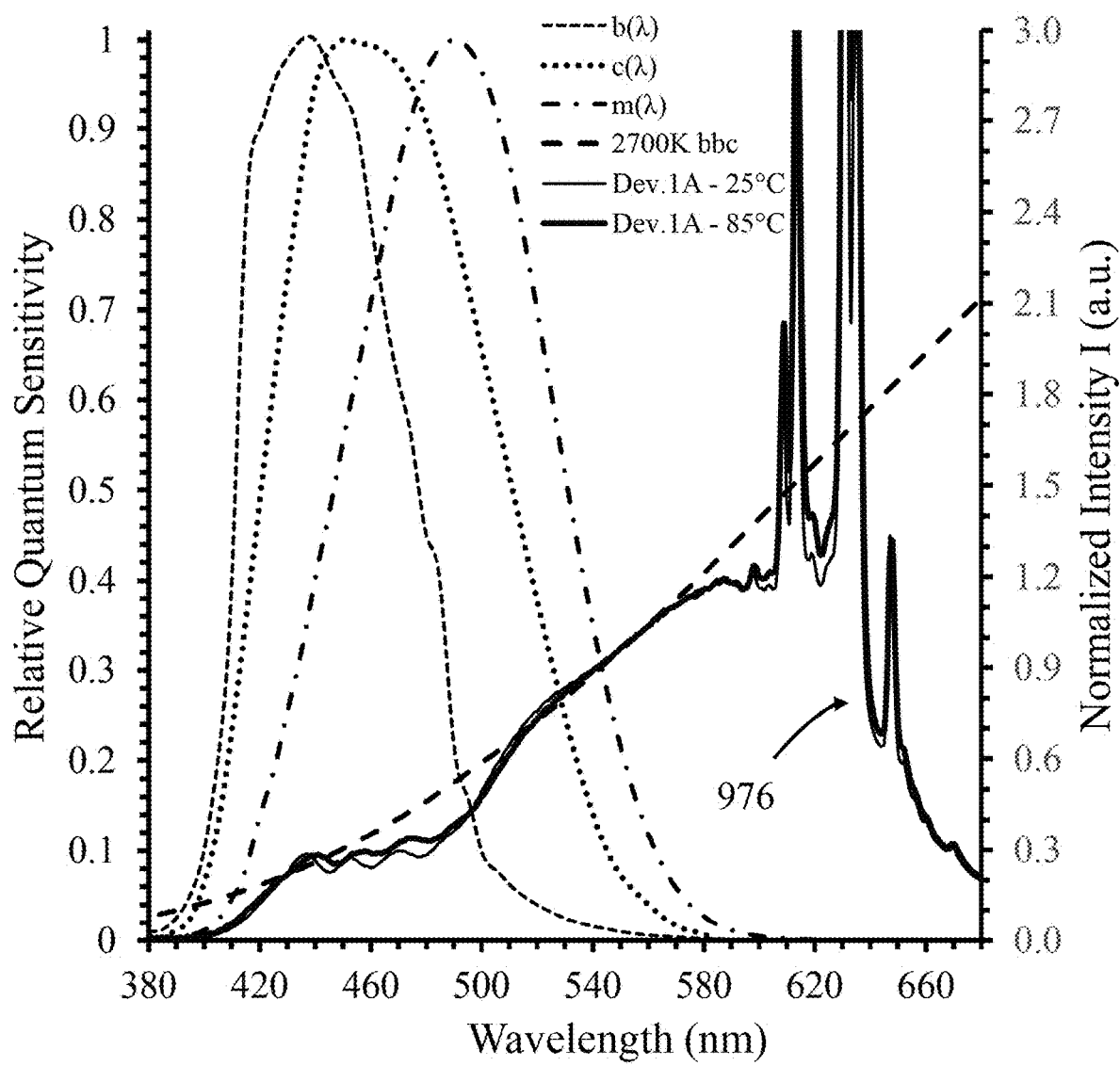
FIG. 9a shows: (A) intensity spectra, normalized intensity I versus wavelength (nm) for: (i) Dev. 1A (thin solid line) operated at 25° C., (ii) Dev. 1A (thick solid line) operated at 85° C., (iii) black-body-curve (bbc)—Planckian spectrum (thick dashed line) for a CCT of 2700K that is nominally the same as Dev. 1A; and (B) sensitivity spectra, relative quantum sensitivity versus wavelength (nm) for: (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line)
Figure 9B:
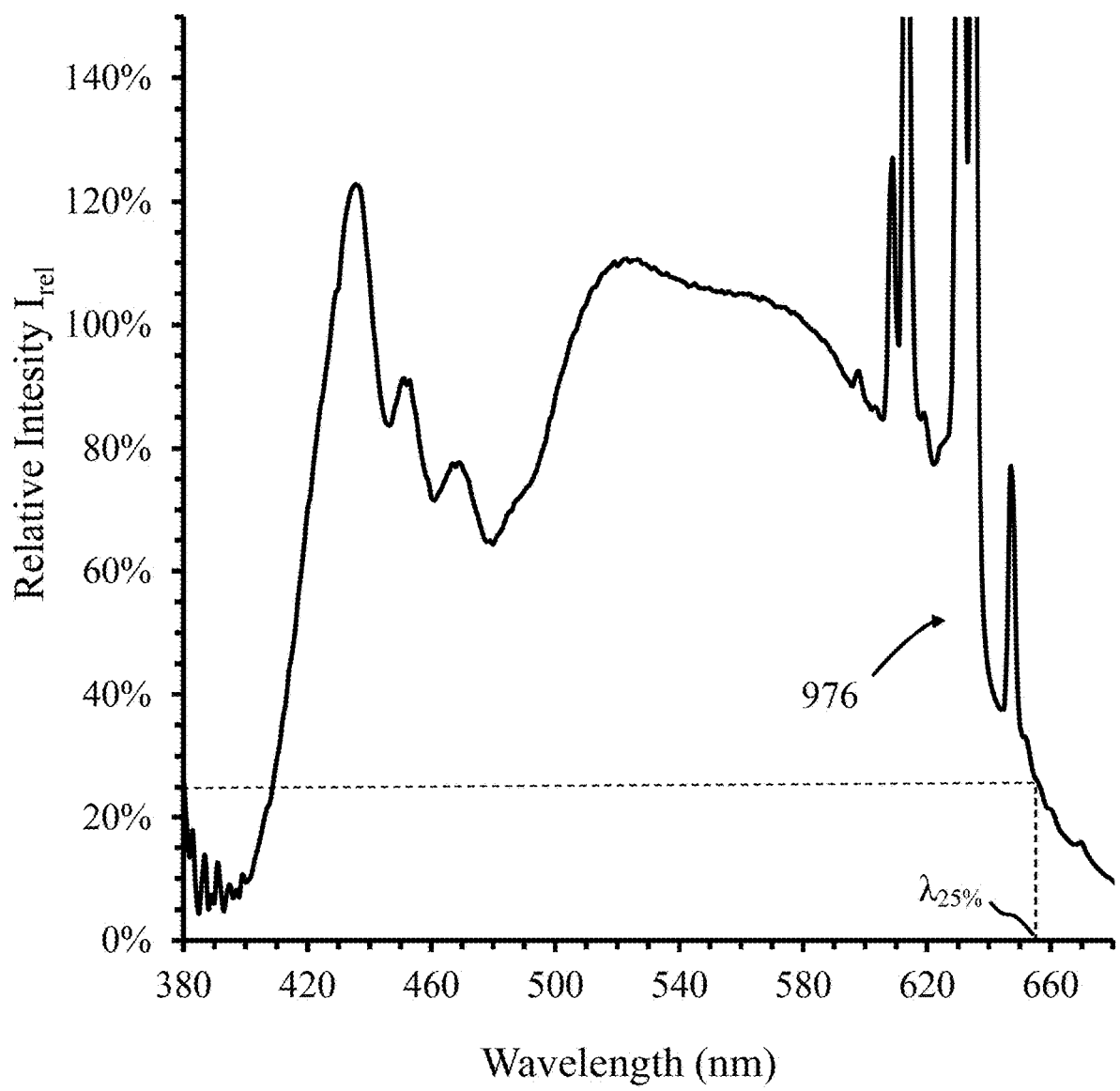
FIG. 9b shows a relative intensity spectrum, $I_{rel.}(\lambda)$ versus wavelength (nm), for Dev.1A operated at 25° C.
Figure 9C:
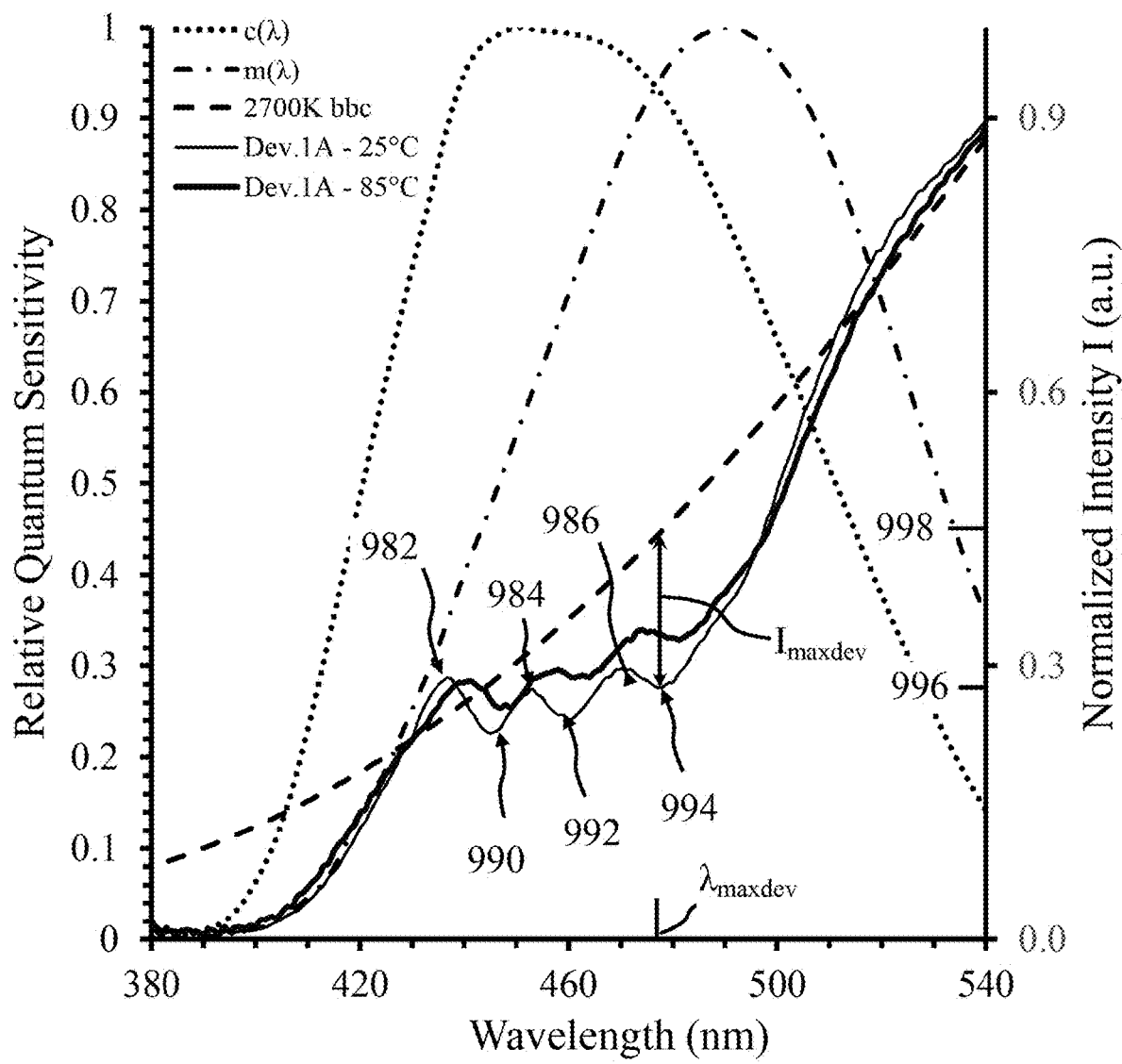
FIG. 9c is an enlarged portion of FIG. 7a for wavelengths from 380 nm to 540 nm.
Figure 9D:
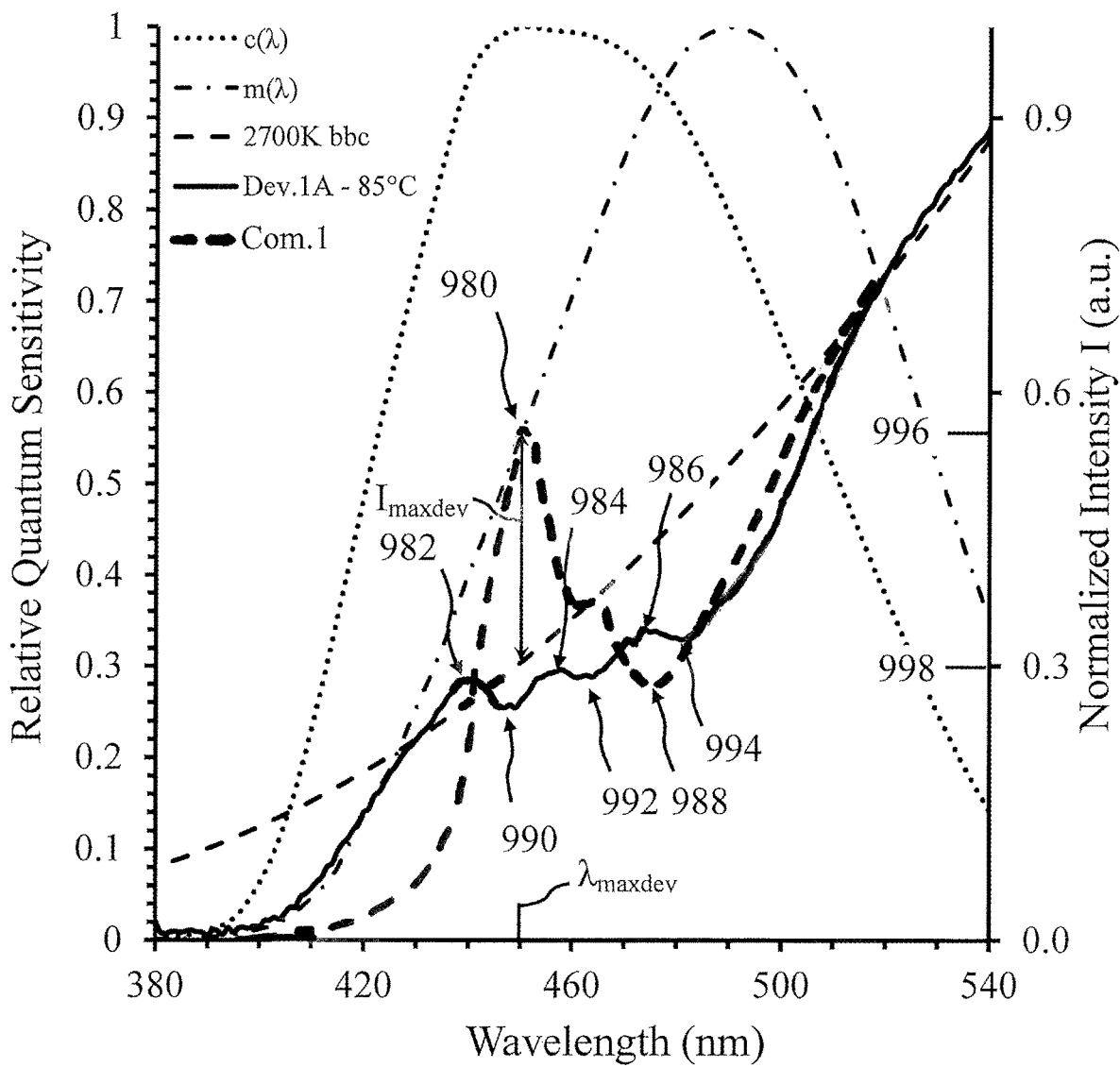
FIG. 9d shows: (A) intensity spectra, normalized intensity I versus wavelength (nm) for (i) Dev. 1A (thick solid line) operated at 85° C., (ii) Com.1 (thick dashed line), (iii) black-body-curve bbc (thick dashed line) for a CCT of 2700K that is nominally the same as Dev. 1A and Com.1; and (B) sensitivity spectra, relative quantum sensitivity versus wavelength (nm) for (i) Circadian Sensitivity $c(\lambda)$ (dotted line), and (ii) Melanopic Sensitivity $m(\lambda)$ (dash dot line)
Figure 10:
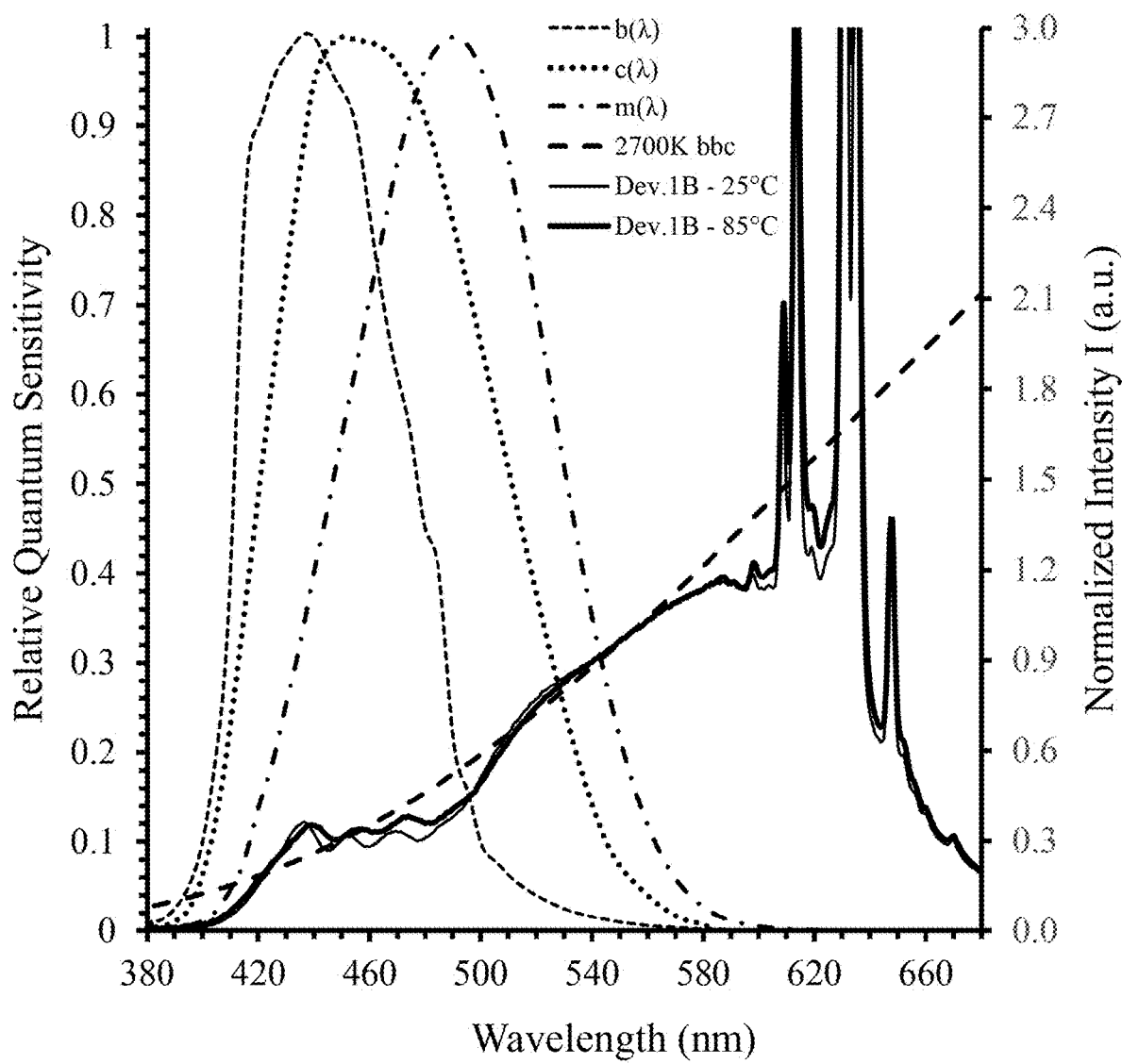
FIG. 10 shows: (A) intensity spectra, normalized intensity I versus wavelength (nm) for: (i) Dev. 1B (thin solid line) operated at 25° C., (ii) Dev. 1B (thick solid line) operated at 85° C., (iii) black-body-curve (bbc)—Planckian spectrum (thick dashed line) for a CCT of 2700K that is nominally the same as Dev. 1B; and (B) sensitivity spectra, relative quantum sensitivity versus wavelength (nm) for: (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line)
Figure 11:
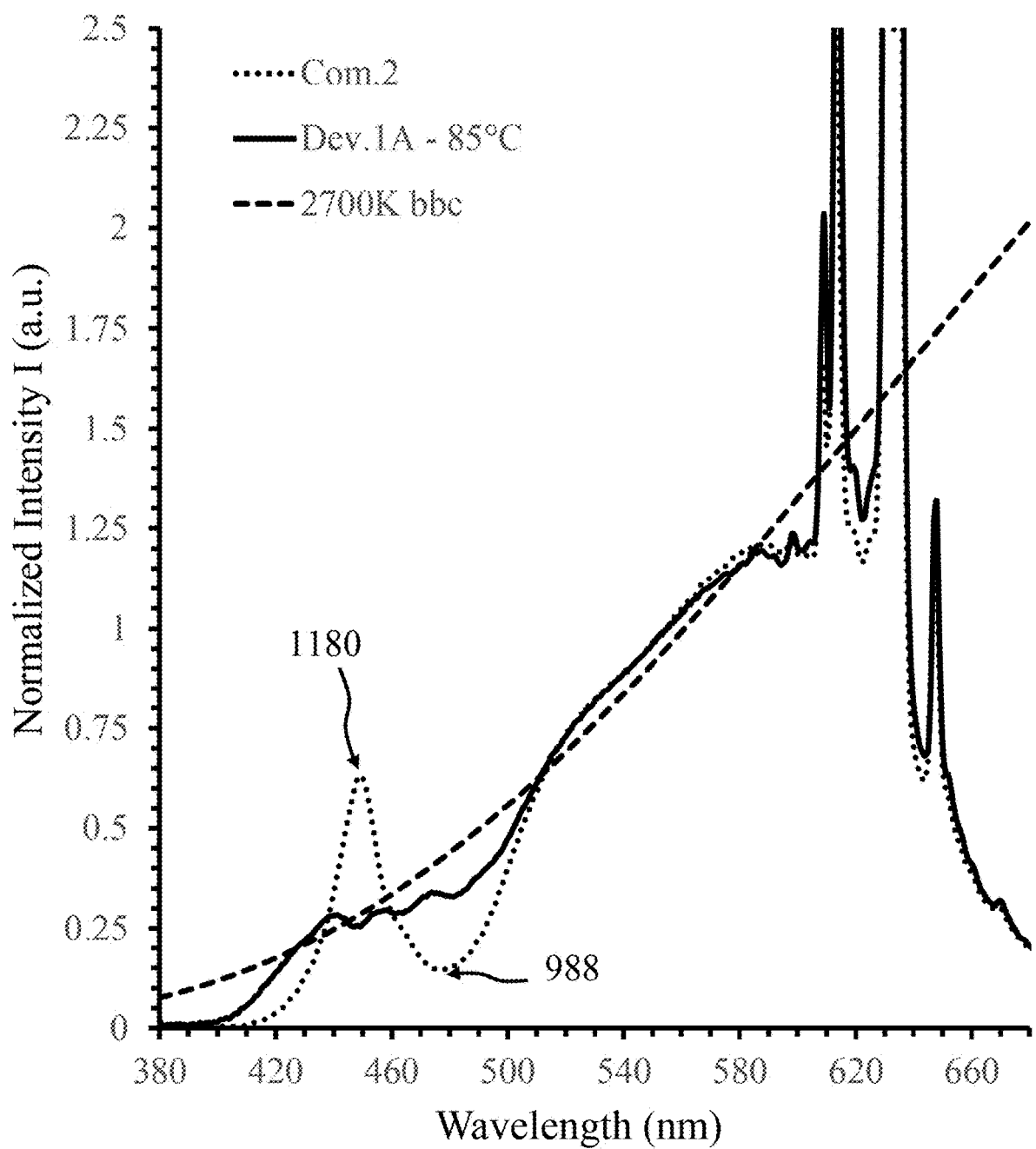
FIG. 11 shows intensity spectra, normalized intensity I versus wavelength (nm) for: (i) Dev. 1A (solid line) operated at 85° C., (ii) Com.2 (dotted line), and (iii) black-body-curve (bbc)—Planckian spectrum (thick dashed line) for a CCT of 2700K that is nominally the same as Dev. 1A.

FIG. 9a shows: (A) intensity spectra, normalized intensity I versus wavelength (nm) for: (i) Dev. 1A (thin solid line) operated at 25° C., (ii) Dev. 1A (thick solid line) operated at 85° C., (iii) black-body-curve bbc (thick dashed line) for a CCT of 2700K that is nominally the same as Dev. 1A; and (B) sensitivity spectra, relative quantum sensitivity versus wavelength (nm) for: (i) Blue Sensitivity b($\lambda$) (thin dashed line), (ii) Circadian Sensitivity c($\lambda$) (dotted line), and (iii) Melanopic Sensitivity m($\lambda$) (dash dot line). FIG. 9b shows a relative intensity spectrum, $I_{rel.}$ ($\lambda$) versus wavelength (nm), for Dev.1A operated at 25° C. FIG. 9c is an enlarged portion of FIG. 9a for wavelengths from 380 nm to 540 nm. FIG. 9d shows: (A) intensity spectra, normalized intensity I versus wavelength (nm) for: (i) Dev. 1A (thick solid line) operated at 85° C., (ii) Com.1 (thick dashed line), (iii) black-body-curve bbc (thick dashed line) for a CCT of 2700K that is nominally the same as Dev. 1A and Com.1; and (B) sensitivity spectra, relative quantum sensitivity versus wavelength (nm) for (i) Circadian Sensitivity c($\lambda$) (dotted line), and (ii) Melanopic Sensitivity m($\lambda$) (dash dot line). FIG. 10 shows: (A) intensity spectra, normalized intensity I versus wavelength (nm) for: (i) Dev. 1B (thin solid line) operated at 25° C., (ii) Dev. 1B (thick solid line) operated at 85° C., (iii) black-body-curve (bbc)—Planckian spectrum (thick dashed line) for a CCT of 2700K that is nominally the same as Dev. 1B; and (B) sensitivity spectra, relative quantum sensitivity versus wavelength (nm) for: (i) Blue Sensitivity b($\lambda$) (thin dashed line), (ii) Circadian Sensitivity c($\lambda$) (dotted line), and (iii) Melanopic Sensitivity m($\lambda$) (dash dot line). FIG. 11 shows intensity spectra, normalized intensity I versus wavelength (nm) for (i) Dev. 1A (solid line) operated at 85° C., (ii) Com.2 (dotted line), and (iii) black-body-curve (bbc)—Planckian spectrum (thick dashed line) for a CCT of 2700K that is nominally the same as Dev. 1A. To make a meaningful comparison of the intensity spectra of Dev.1A, Com.1, Com.2 and bbc each has been normalized such that each has a CIE 1931 XYZ relative luminance Y=100. The intensity data are normalized using the CIE 1931 photopic luminosity function y($\lambda$) of a standard observer which takes account of the photopic response (sensitivity) of an observer. The Planckian spectrum (curve) or black-body curve in FIGS. 9a, 9b, 9c, 10 and 11 represents the spectrum for a General CRI Ra equal to 100 for a given color temperature (CCT). Accordingly, for a white light emitting device of a given color temperature to have the highest color rendering possible, its emission spectrum should match as closely as possible the black-body spectrum of the same color temperature.

Referring to FIG. 9a it will be observed that Dev. 1A, at operating temperatures of 25° C. (thin solid line) and 85° C. (thick solid line), generates white light whose spectrum has a form (disregarding the peaks at about 610 nm and 630 nm that exceed the bbc) that generally resembles that of the bbc (thick dashed line) over a wavelength range from about 420 nm to about 635 nm. The spectra also exhibit a tail, generally denoted 976, in the orange to red region beginning from the peak emission wavelength $\lambda_{pe}$ (not visible due to the intensity scale of FIG. 9a) of the narrowband red photoluminescence material. The tail represents a rapid decrease (drop) in light intensity from the peak emission intensity to below that of the bbc. FIG. 9b shows the percentage relative intensity ($I_{rel.}$) spectrum, that is the normalized intensity of the device ($I_{Dev.}$) relative to the normalized intensity of the bbc ($I_{bbc}$). This relationship can be thus defined as $I_{rel.}$=100×($I_{Dev.}$/$I_{bbc}$) and represents the percentage deviation in intensity of the device from the bbc versus wavelength. It will be appreciated for wavelengths at which the percentage relative intensity is equal to 100% corresponds to a perfect correlation with the bbc, in that there is no deviation. For example, it can be seen that for wavelength between 500 nm and 600 nm, in which the photopic response of the eye is at its greatest, the relative intensity ranges from 80% to 120% (i.e. 20% deviation) indicating a close correlation (resemblance) of the intensity of the device with that of the bbc of the same color temperature. As will be noted from FIG. 9b the relative intensity of the tail 976 in the orange to red region of the spectrum decreases to 25% at a wavelength 125% of about 655 nm. How quickly the tail drops to this value is largely determined by the peak emission wavelength $\lambda_{pe}$ and FWHM of the narrowband red photoluminescence material.

Referring to FIG. 9c the Circadian Action Spectrum (CAS), also referred to as spectral circadian efficiency or sensitivity function c($\lambda$), represents human non-visual relative sensitivity to light. The maximum sensitivity of c($\lambda$) occurs at a wavelength of 460 nm. The CAS suggests that the 430 nm to 520 nm portion of the spectrum as being the most significant wavelengths for providing circadian input for regulating melatonin secretion. FIG. 9C defines various parameters used in the patent specification and illustrates a principle of the invention.

Visually comparing the spectrum of Com.1 with the back-body curve (bbc), it will be noted that the spectrum exhibits a single peak 980 (455 nm), corresponding to the excitation light generated by the narrowband excitation source, whose intensity deviates significantly from that of the bbc (i.e. peak intensity is very much higher than that of the bbc at the same wavelength of 455 nm). In comparison, the spectrum for Dev.1A exhibits three peaks 982 (440 nm), 984 (450 nm) and 986 resulting from the three blue light emissions ($\lambda_{d1A}$, $\lambda_{d2A}$, $\lambda_{d3A}$) generated by the broadband excitation source whose intensity deviates, compared with Com.1, deviate only slightly from that of the bbc (i.e. the peak intensities are slightly higher or slightly lower than the bbc at the same wavelengths). It is to be further noted that the peak 980 occurs at a wavelength of about 455 nm that is close to the maximum sensitivity of the CAS which is at a wavelength of 460 nm. Moreover, it is to be noted that the spectrum of Com. 1 exhibits a trough (valley) 988 whose minimum intensity deviates significantly from that of the bbc (i.e. the trough intensity is much lower than the bbc). In comparison, the spectrum of Dev. 1A exhibits three troughs (valley or local minima) 990 (748 nm) and 992 (462 nm) and 994 (480 nm) whose minimum intensity deviates only slightly from that of the bbc (i.e. the trough intensity is slightly lower than the bbc). As can be seen from the figure, the smaller deviation of emission peaks 982, 984 and 986 of Dev.1A (compared with peak 980 of Com.1) and the smaller deviation of troughs 990, 992 and 994 of Dev.1A (compared with trough 994 of Com.1) from the bbc indicates that spectrum of Dev.1A more closely resembles the bbc (Planckian spectrum) over a wavelength range from 430 nm to 520 nm (blue to cyan). It will be further appreciated that spectrum of Dev.1A more closely resembles natural light over this wavelength region where human non-visual perception measured by CAF (Circadian Action Factor) and MR (Melanopic Response) are affected most and this can be beneficial to human wellbeing.

A metric for quantifying how closely the spectrum resembles the bbc is a maximum (largest) percentage intensity deviation ($I_{maxdev}$) from the intensity of light of the bbc of the same Correlated Color Temperature. That is, over a wavelength range from about 430 nm to 520 nm, $I_{maxdev}$ is the maximum (largest) percentage intensity difference between the intensity of the spectrum and the intensity of the bbc. The maximum deviation can be positive (such as a peak or trough where the spectrum intensity is greater than the bbc) or negative (such as a peak or trough where the spectrum intensity is less than the bbc). To make a meaningful comparison of the spectra, each spectrum is normalized to have the same CIE 1931 XYZ relative luminance Y. The spectrum is normalized using the photopic luminosity function y(λ)—sometimes referred to as the photopic or visual luminous efficiency function v(λ)—of a standard observer which takes account of the photopic (visual) response of an observer and are for the same correlated color temperature. $I_{maxdev}$ is thus the maximum (greatest) percentage intensity difference between the normalized intensity of the spectrum and the normalized intensity of the bbc over a wavelength range from about 430 nm to 520 nm. $I_{maxdev}$ is defined as:

$$I_{maxdev} = \left[ \frac{\text{Intensity of spectrum at } \lambda_{maxdev} \times 100}{\text{Intensity of } bbc \text{ at } \lambda_{maxdev}} \right] - 100$$

For example, referring to FIG. 9*d*, for Com.1 A the maximum deviation of the spectrum from the bbc corresponds to peak 980 at a wavelength $\lambda_{maxdev} \approx 450$ nm. The intensity of the spectrum at $\lambda_{maxdev}$ is denoted 996 and the intensity of the bbc at $\lambda_{maxdev}$ is denoted 998. Therefore, using the calculation above, over the wavelength range from about 430 nm to about 520 nm, the spectrum of Com.1 has a maximum percentage intensity deviation $I_{maxdev}$ of 95%, that is at the maximum percentage intensity deviation the normalized intensity of Com.1 at wavelength $\lambda_{maxdev}$ is 195% of the normalized intensity of the bbc at the same wavelength. In contrast, the maximum deviation of the spectrum of Dev.1A from the bbc corresponds to trough 988 at a wavelength $\lambda_{maxdev} \approx 477$ nm (FIG. 9*c*). Using the calculation above, over the wavelength range from about 430 nm to about 520 nm, the maximum percentage intensity deviation $I_{maxdev}$ of the spectrum from the bbc is about 38%, that is at the maximum percentage intensity deviation the normalized intensity of emission spectrum wavelength $\lambda_{maxdev}$ is 62% of the normalized intensity of the bbc at the same wavelength.

It will be noted that Dev.1A in accordance with the invention (comprising a broadband excitation source) compared with the known devices (e.g. Com.1) comprising a narrowband excitation source generates white light with a significantly smaller maximum percentage intensity deviation of the spectrum compared with bbc and this results in the emission spectrum more closely resembling the Planckian spectrum (that is more closely resembling natural sunlight) over a wavelength range from 430 nm to 520 nm (blue to cyan).

It is believed that use of a broadband blue excitation source to change the intensity spectrum, by at least partially filling the trough in the cyan wavelength region of the spectrum, and reduces the peak overshoot in the blue region and that this change of light intensity in cyan wavelength region accounts for the superior color rendering properties of the devices of the invention.

TABLE 4

2700K white light emitting devices - Measured test data (bbc = black-body curve)

| Device | Temp. (° C.) | Intensity (lm) | Efficacy (lm/W) | Maximum deviation $I_{maxdev}$ (%) | Maximum deviation $\lambda_{maxdev}$ (nm) | CIE 1931 CAF (blm/lm) | CIE 1931 CAF (%) | CIE 1931 MR (blm/lm) | CIE 1931 MR (%) | CIE 1931 kBv (mW/lm) | CIE 1931 kBv (%) |
|---|---|---|---|---|---|---|---|---|---|---|---|
| Com.1 | 25 | — | 123 | 80 | 450 | 0.35 | 103.0 | — | — | — | — |
| Dev.1A | 25 (C.) | 125 | 135 | −37 | 480 | 0.30 | 88.2 | 0.38 | 90.5 | 0.22 | 81.5 |
|  | 85 (H) | 110 | 120 | −27 | 484 | 0.30 | 88.2 | 0.38 | 90.5 | 0.23 | 85.2 |
|  | ΔC. → H | −15 | −15 | −10 | 4 | 0.00 | 0.0 | 0.00 | 0.0 | 0.01 | 3.8 |
| Dev.1B | 25 (C.) | 123 | 132 | 56 | 436 | 0.33 | 97.1 | 0.40 | 95.2 | 0.26 | 96.3 |
|  | 85 (H) | 108 | 118 | 47 | 438 | 0.33 | 97.1 | 0.40 | 95.2 | 0.27 | 100.0 |
|  | ΔC. → H | −15 | −15 | −9 | 2 | 0.00 | 0.0 | 0.00 | 0.0 | 0.01 | 3.7 |
| bbc | N/A | N/A | N/A | N/A | N/A | 0.34 | 100.0 | 0.42 | 100.0 | 0.27 | 100.0 |

TABLE 5

2700K white light emitting devices - Measured test data

| Device | Temp. (° C.) | CIE x | CIE y | CCT (K) | R1 | R2 | R3 | R4 | R5 | R6 | R7 |
|---|---|---|---|---|---|---|---|---|---|---|---|
| Com.1 | 25 | — | — | — | 90.7 | 98.3 | 95.5 | 93.1 | 90.1 | 92.4 | 93.7 |
| Dev.1A | 25 (C.) | 0.4593 | 0.4272 | 2835 | 92.8 | 93.4 | 93.2 | 95.4 | 91.7 | 94.2 | 94.9 |
|  | 85 (H) | 0.4656 | 0.4185 | 2683 | 96.9 | 96.8 | 94.5 | 98.2 | 96.1 | 98.6 | 94.1 |
|  | ΔC. → H | −0.0063 | −0.0087 | −152 | 4.1 | 3.4 | 1.3 | 2.8 | 4.4 | 4.4 | −0.8 |
| Dev.1B | 25 (C.) | 0.4533 | 0.4187 | 2857 | 95.8 | 95.3 | 93.4 | 97.3 | 94.6 | 96.7 | 95.3 |
|  | 85 (H) | 0.4596 | 0.4100 | 2699 | 99.8 | 98.9 | 95.1 | 97.3 | 98.9 | 96.9 | 94.4 |
|  | ΔC. → H | 0.0063 | 0.0087 | −158 | 4.0 | 3.6 | 1.7 | 0.0 | 4.3 | 0.2 | −0.9 |

TABLE 6

2700K white light emitting devices - Measured test data

| Device | Temp. (° C.) | R8 | R9 | R10 | R11 | R12 | R13 | R14 | R15 | Ra |
|---|---|---|---|---|---|---|---|---|---|---|
| Com.1 | 25 | 80.7 | 53.7 | 84.2 | 94.0 | 79.7 | 91.0 | 96.7 | 85.9 | 91.2 |
| Dev.1A | 25 (C.) | 83.2 | 56.2 | 82.8 | 96.1 | 82.4 | 92.2 | 94.7 | 87.3 | 92.4 |
|  | 85 (H) | 85.6 | 64.1 | 89.4 | 99.1 | 91.5 | 96.5 | 95.0 | 91.6 | 95.1 |
|  | ΔC. → H | 2.4 | 7.9 | 6.6 | 3.0 | 9.1 | 4.3 | 0.3 | 4.3 | 2.7 |
| Dev.1B | 25 (C.) | 86.8 | 65.0 | 86.7 | 98.5 | 87.6 | 95.1 | 94.7 | 90.9 | 94.4 |
|  | 85 (H) | 88.9 | 72.3 | 93.8 | 95.7 | 97.1 | 99.5 | 95.2 | 95.2 | 96.3 |
|  | ΔC. → H | 2.1 | 7.3 | 7.1 | −2.8 | 9.5 | 4.4 | 0.5 | 4.3 | 1.9 |

TABLE 7

2700K white light emitting devices - IES TM-30-15 measured test data

Local Color Fidelity ($R_{f,hj}$) for Hue-Angle Bin (hj)

| Device | h1 | h2 | h3 | h4 | h5 | h6 | h7 | h8 | h9 |
|---|---|---|---|---|---|---|---|---|---|
| Dev.1B | 93 | 96 | 93 | 95 | 93 | 91 | 93 | 94 | 95 |

TABLE 8

2700K white light emitting devices - IES TM-30-15 measured test data

Local Color Fidelity ($R_{f,hj}$) for Hue-Angle Bin (hj)

| Device | h10 | h11 | h12 | h13 | h14 | h15 | h16 | Fidelity Index $R_f$ | Gamut Index $R_g$ |
|---|---|---|---|---|---|---|---|---|---|
| Dev.1B | 96 | 98 | 89 | 86 | 89 | 92 | 90 | 93 | 101 |

Referring to Tables 4, 5 and 6, it is to be noted that at an operating temperature of 25° C. (C—Cold) devices Devs.1A and 1B have an efficacy of at least 130 lm/W (135 lm/W and 132 lm/W respectively) and produce white light with a General Color Rendering Index CRI Ra of about 93 (92.4 and 94.4 respectively) with each of CRI R1 to R7 and R11 to R15 of about 90 or higher (91.7 to 96.1 and 93.4 to 98.5 respectively), while CRI R8 (corresponding to "Reddish Purple") is greater than 50 and less than 90 (83.2 and 86.8 respectively), while CRI R9 (corresponding to "Saturated Red") is greater than 50 and less than 90 (56.2 and 65.0 respectively) and CRI R10 (corresponding to "Saturated Yellow") is greater than 50 and less than 90 (82.8 and 86.7 respectively). When operated at an operating temperature of 85° C. (H—Hot), the efficacy of devices Dev.1A and Dev.1B drops to about 120 lm/W (120 lm/W and 118 lm/W respectively) and they produce white light with a General Color Rendering Index CRI Ra of about 95 (95.1 and 96.3 respectively) with each of CRI R1 to R7 and R10 to R15 of about 90 or higher (89.4 to 99.1 and 93.8 to 99.8 respectively), while CRI R8 is greater than 72 and less than 90 (85.6 and 88.9 respectively), while CRI R9 is greater than 50 and less than 90 (64.1 and 72.3 respectively).

In comparison, device Com.1 has an efficacy of only 123 lm/W and produces white light with a CRI Ra of about 91 (91.2) in which CRI R1 to CRI R7, R11, R13 and R14 are about 90 or higher (90.7 to 98.3), while CRI R8 is greater than 72 and less than 90 (80.7), while CRI R9 is greater than 50 and less than 90 (53.7). Further, it is to be noted that while the quality of light produced by Devs.1A and 1B is substantially the same as that of Com.1, the efficacy increases substantially by about 8% (from 123 lm/W to at least 130 lm/W). It is believed that the increase in efficacy results from the use a narrowband red photoluminescence material, KSF in this particular example. Tests indicate that similar increases in efficacy are expected when using other narrowband red photoluminescence materials such as KGF and KTF or combinations thereof.

Referring to Tables 7 and 8, in terms of IES TMS-30-15 metrics, Dev.1B produces white light with a Gamut Index $R_g$ of 101 and Fidelity Index $R_f$ of 93. Moreover, it is to be noted that the Local Color Fidelity ($R_{f,hj}$) for hue-angle bins h1 to h12 and h14 to h16 are about 90 or higher while $R_{f,hj}$ for hue-angle bin h13 is 86.

FIG. 11 visually illustrates the effect of using a broadband excitation source (Dev.1A) compared with a comparative device (Com.2) that utilizes a narrowband excitation source. It will be apparent from the figure that Dev.1A generates white light that closely resembles the bbc in the wavelength range 420 nm to 530 nm as compared Com.2 that exhibits pronounced deviations corresponding to peak 1180 and trough 1188.

5000K Full Spectrum White Light Emitting Devices— Test Data

Tables 9, 10 and 11 tabulate measured optical test data for 5000K white light emitting devices Dev.2A, Dev.2B, a known 5000K CRI90 comparative device Com.3 and a comparative device Com.4. Tables 12 and 13 tabulate measured IEC TM-30-15 optical test data for Dev.2A.

As described above, light emitting device Dev.2A comprises a 2835 SMD package containing three LED chips of dominant wavelength $\lambda_{d1A}$=441 nm, $\lambda_{d2A}$=456 nm and $\lambda_{d3A}$=469 nm while device Dev.2B comprises three LED chips of dominant wavelength $\lambda_{d1B}$=446 nm, $\lambda_{d2B}$=456 nm and $\lambda_{d3B}$=469 nm. Devs.2A and 2B each comprise the same combination of GAL520 ($Lu_{3-x}(Al_{1-y}Ga_y)_5O_{12}:Ce_x$, X=520 nm), CASN615 ($Ca_{1-x}SrAlSiN_3:Eu$, $\lambda_{pe}$=615 nm, FWHM≈74 to 75 nm), and KSF ($K_2SiF_6:Mn^{4+}$, $\lambda_{pe}$=630 to 632 nm, FWHM≈5 to 10 nm) phosphors. Comparative device Com.3 comprises a known 2835 packaged white light emitting device which utilizes a narrowband excitation source and has a nominal General CRI Ra of 90. Comparative device Com. 4 comprises a 2835 packaged white light emitting device which utilizes broadband excitation source and has a broadband orange to red photoluminescence material rather than a narrowband photoluminescence material.

Figure 12:
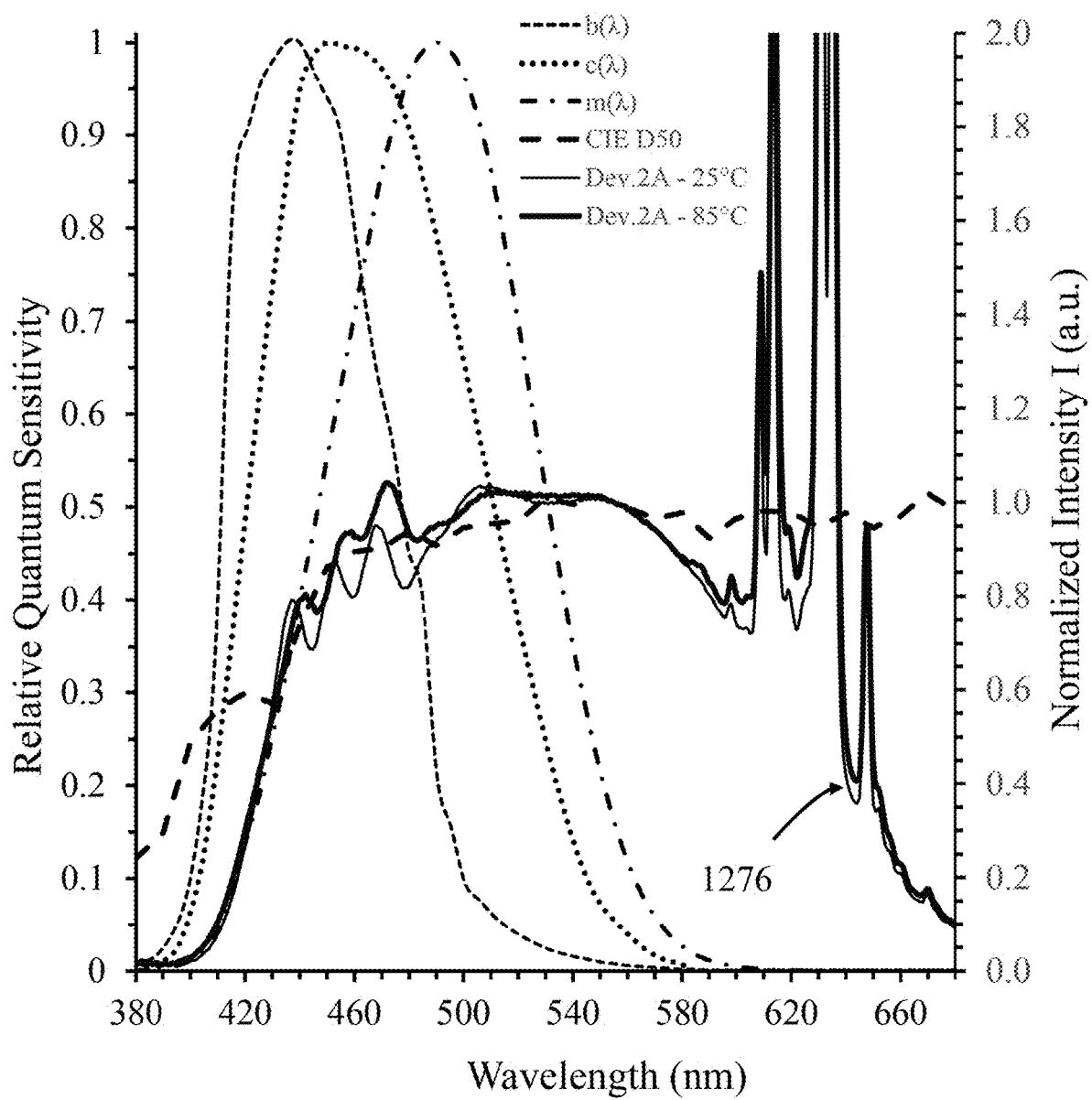
FIG. 12 shows: (A) intensity spectra, normalized intensity I versus wavelength (nm) for (i) Dev. 2A (thin solid line) operated at 25° C., (ii) Dev. 2A (thick solid line) operated at 85° C., (iii) CIE Standard Illuminant D50 (thick dashed line) for a CCT of 5000K that is nominally the same as Dev. 2A; and (B) sensitivity spectra, relative quantum sensitivity versus wavelength (nm) for: (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line)

FIG. 12 shows: (A) intensity spectra, normalized intensity I versus wavelength (nm) for: (i) Dev. 2A (thin solid line) operated at 25° C., (ii) Dev. 2A (thick solid line) operated at 85° C., (iii) CIE Standard Illuminant D50 (thick dashed line) for a CCT of 5000K that is nominally the same as Dev. 2A; and (B) sensitivity spectra, relative quantum sensitivity versus wavelength (nm) for: (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line). Analysis of the spectrum indicates that over a wavelength range 430 nm to 520 nm (blue to cyan), a maximum percentage normalized intensity deviation $I_{maxdev}$ of about −14% between the normalized intensity of light emitted by device Dev.2A and the normalized intensity of light of the CIE Standard Illuminant D of the same Correlated Color Temperature (5000K). This is to be contrasted with the known devices, that utilizes a narrowband excitation light source, which generate white light that exhibits a maximum percentage deviation $I_{maxdev}$ in normalized intensity of about 115%. The relative intensity of the tail 1276 in the orange to red region of the spectrum of Dev.2A decreases to 25% at a wavelength $\lambda_{maxdev}$ of about 655 nm the same as that of Dev.1A.

Figure 13:
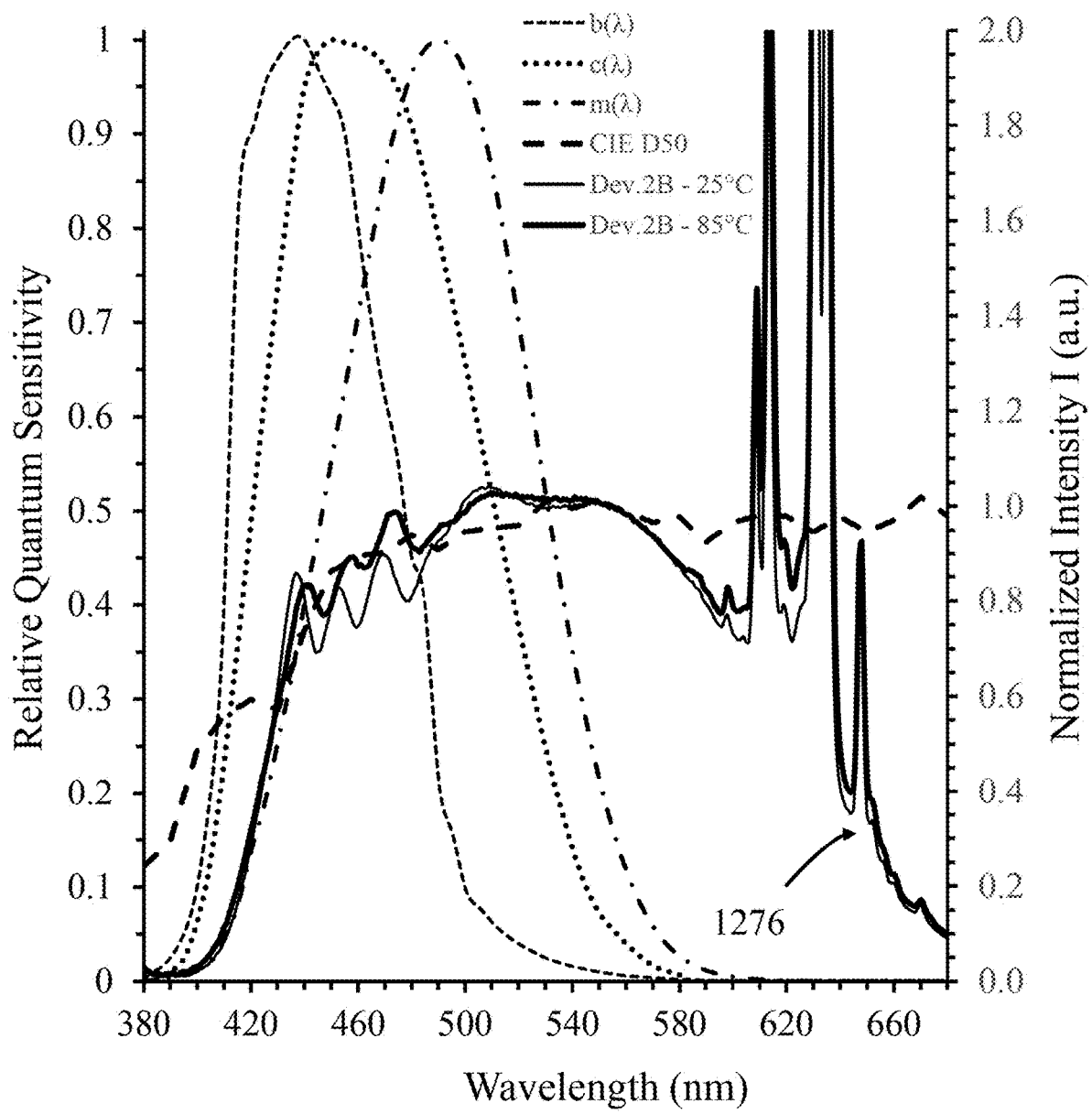
FIG. 13 shows: (A) intensity spectra, normalized intensity I versus wavelength (nm) for: (i) Dev. 2B (thin solid line) operated at 25° C., (ii) Dev. 2B (thick solid line) operated at 85° C., (iii) CIE Standard Illuminant D50 (thick dashed line) for a CCT of 5000K that is nominally the same as Dev. 2B; and (B) sensitivity spectra, relative quantum sensitivity versus wavelength (nm) for (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line)

FIG. 13 shows: (A) intensity spectra, normalized intensity I versus wavelength (nm) for: (i) Dev. 2B (thin solid line) operated at 25° C., (ii) Dev. 2B (thick solid line) operated at 85° C., (iii) CIE Standard Illuminant D50 (thick dashed line) for a CCT of 5000K that is nominally the same as Dev. 2B; and (B) sensitivity spectra, relative quantum sensitivity versus wavelength (nm) for (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line). Analysis of the spectrum indicates that over a wavelength range 430 nm to 520 nm (blue to cyan), a maximum percentage normalized intensity deviation $I_{maxdev}$ of about 14% between the normalized intensity of light emitted by devices Dev.2B and the normalized intensity of light of the CIE Standard Illuminant D of the same Correlated Color Temperature (5000K). This is to be contrasted with the known devices, that utilizes a narrowband excitation light source, which generate white light that exhibits a maximum percentage normalized intensity deviation of about 115%. The relative intensity of the tail 1376 in the orange to red region of the spectrum of Dev.2B decreases to 25% at a wavelength $\lambda_{125\%}$ of about 655 nm the same as that of Dev.1B.

Referring to Tables 9, 10 and 11 it is to be noted that devices Devs.2A and 2B, when operated at 25° C. (C) have an efficacy of at least 135 lm/W (138 lm/W and 139 lm/W respectively) and produce white light with a General Color Rendering Index CRI Ra of about 98 (97.8 and 98.4 respectively) with each of CRI R1 to R15 are 95 or higher (95.9 to 98.6 and 96.4 to 99.0 respectively. When operated at an operating temperature of 85° C. (H—Hot) the efficacy of devices Dev.2A and Dev.2B drops to at least 120 lm/W (122 lm/W and 123 lm/W respectively) and they produce white light with a General Color Rendering Index CRI Ra of about 92 (92.2 and 93.2 respectively) with each of CRI R1 to R8 and R11 to R15 of at least about 90 or higher (89.2 to 97.4) for Dev.1A and each of CRI R1 to R8 and R10 to R15 of at least about 90 or higher (90.3 to 97.4) for Dev.1B, while CRI R9 is greater than 72 and less than 90 (74.0 and 77.7 respectively) and CRI R10 for Dev.2A is about 88 (88.1).

In comparison, known comparative device Com.3 operated at 25° C. has an efficacy of 135 lm/W and produces white light with a CRI Ra of about 94 in which CRI R1 to CRI R8, CRI R10 to CRI R11 and CRI R13 to CRI R15 are about 90 or higher (90.5 to 98.3), while CRI R9 is about 87 (87.1) and CRI R12 is about 65 (64.6). Further, it is to be noted that while the quality of light produced by Devs.2A and 2B is not only better than that of the known device Com.3, the efficacy increases by about 2% (from 135 lm/W to 138 lm/W). It is believed that the increase in efficacy results from the use a narrowband red photoluminescence material, KSF in this particular example. Tests indicate that similar increases in efficacy are expected when using other narrowband red photoluminescence materials such as KGF and KTF or combinations thereof.

Referring to Tables 11 and 12, in terms of IES TMS-30-15 metrics, Dev.2A produces white light with a Gamut Index $R_g$ of 101 and Fidelity Index $R_f$ of 93. Moreover, it is to be noted that the Local Color Fidelity ($R_{f,hj}$) for hue-angle bins h1 to h16 are at about 90 or higher (89 to 95).

Figure 14:
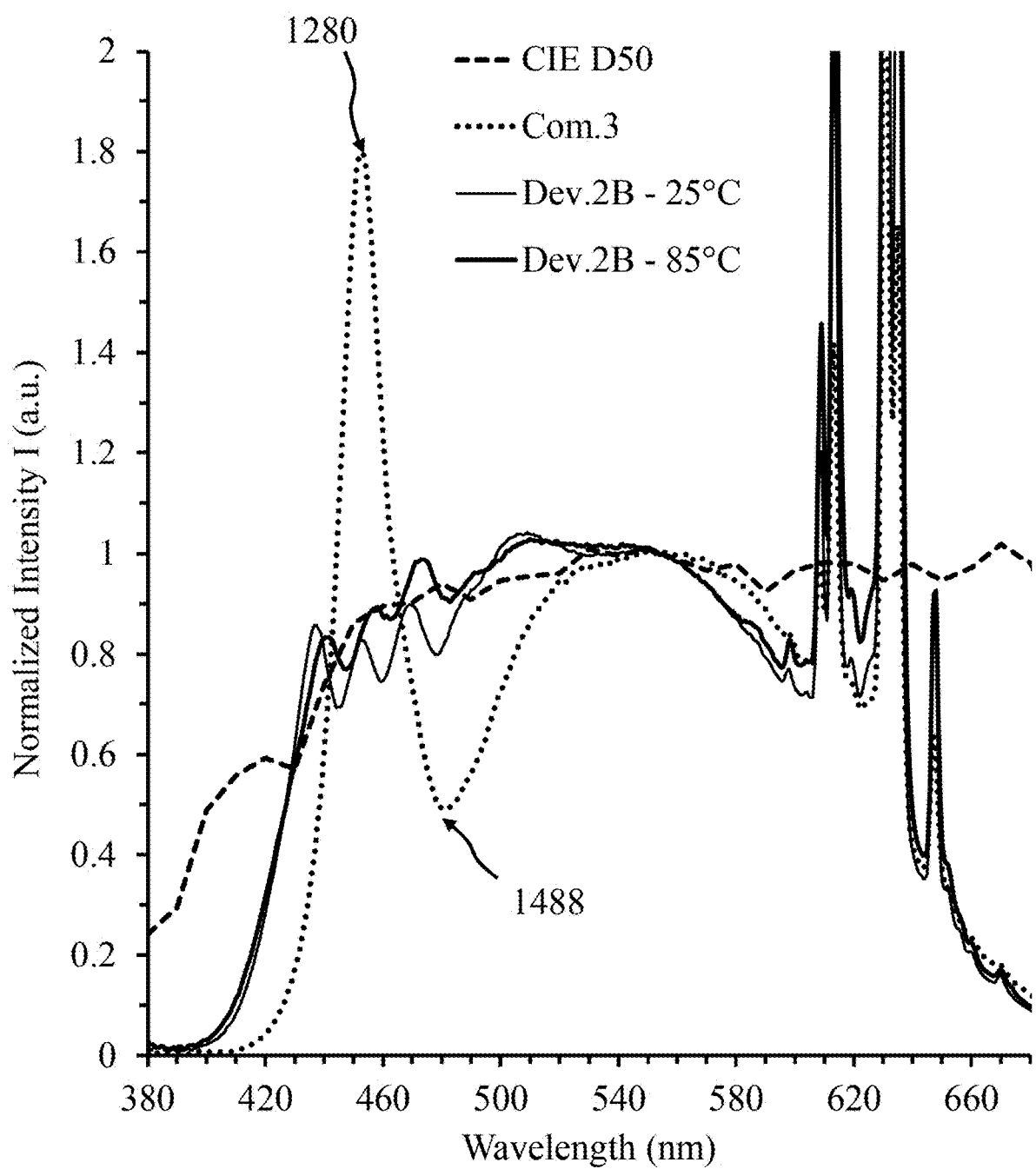
FIG. 14 shows intensity spectra, normalized intensity I versus wavelength (nm) for: (i) Dev. 2B (thin solid line) operated at 25° C., (ii) Dev. 2B (thick solid line) operated at 85° C., (iii) Com.3, and (iv) CIE Standard Illuminant D50 (thick dashed line) for a CCT of 5000K that is nominally the same as Dev. 2B.

FIG. 14 visually illustrates the effect of using a broadband excitation source (Dev.2A) compared with a comparative device (Com.3) that utilizes a narrowband excitation source. It will be apparent from the figure that Dev.2A generates white light that closely resembles the bbc in the wavelength range 420 nm to 530 nm as compared Com.3 that exhibits pronounced deviations corresponding to peak 1480 and trough 1488.

TABLE 9

5000K white light emitting devices - Measured test data (bbc = black-body curve)

| Device | Temp. (° C.) | Intensity (lm) | Efficacy (lm/W) | Maximum deviation I$_{maxdev}$ (%) | Maximum deviation λ$_{maxdev}$ (nm) | CIE 1931 CAF (blm/lm) | CIE 1931 CAF (%) | CIE 1931 MR (blm/lm) | CIE 1931 MR (%) | CIE 1931 kBv (mW/lm) | CIE 1931 kBv (%) |
|---|---|---|---|---|---|---|---|---|---|---|---|
| Com.3 | 25 (C.) | — | 135 | 115 | 460 | 0.75 | 87.4 | — | — | — | — |
| Com.4 | 25 (C.) | 103 | 115 | 28 | 468 | — | — | — | — | — | — |
|  | 85 (H) | 93 | 105 | 44 | 473 | — | — | — | — | — | — |
|  | ΔC. → H | −10 | −10 | 16 | 5 | — | — | — | — | — | — |
| Dev.2A | 25 (C.) | 127 | 138 | −14 | 476 | 0.72 | 118.3 | 0.77 | 120.3 | 0.64 | 110.3 |
|  | 85 (H) | 112 | 122 | 12 | 471 | 0.73 | 119.7 | 0.77 | 120.3 | 0.65 | 112.1 |
|  | ΔC. → H | −15 | −16 | −2 | −5 | 0.01 | 1.4 | 0.00 | 0.0 | 0.01 | 1.8 |
| Dev.2B | 25 (C.) | 126 | 139 | −12 | 458 | 0.72 | 118.3 | 0.77 | 120.3 | 0.65 | 112.1 |
|  | 85 (H) | 111 | 123 | 10 | 476 | 0.73 | 119.7 | 0.77 | 120.3 | 0.66 | 112.1 |
|  | ΔC. → H | −14 | −15 | 2 | 18 | 0.01 | 1.4 | 0.00 | 0.0 | 0.01 | 0.0 |
| bbc | N/A | N/A | N/A | N/A | N/A | 0.61 | 100.0 | 0.64 | 100.0 | 0.58 | 100.0 |

TABLE 10

5000K white light emitting devices - Measured test data

| Device | Temp. (° C.) | CIE x | CIE y | CCT (K) | R1 | R2 | R3 | R4 | R5 | R6 | R7 |
|---|---|---|---|---|---|---|---|---|---|---|---|
| Com.3 | 25 (C.) | — | — | — | 96.0 | 99.1 | 98.3 | 88.8 | 92.4 | 95.7 | 91.4 |
| Com.4 | 25 (C.) | 0.3453 | 0.3536 | 5002 | 98.7 | 99.1 | 97.5 | 97.5 | 98.5 | 98.4 | 98.4 |
|  | 85 (H) | 0.3446 | 0.3508 | 5016 | 96.9 | 97.0 | 98.7 | 97.8 | 95.7 | 95.7 | 98.0 |
|  | ΔC. → H | −0.0007 | −0.0028 | 14 | −1.8 | −2.1 | 1.0 | 0.3 | −2.8 | −2.8 | −0.4 |
| Dev.2A | 25 (C.) | 0.3461 | 0.3668 | 5013 | 97.7 | 98.6 | 98.0 | 97.2 | 98.1 | 97.0 | 97.8 |
|  | 85 (H) | 0.3536 | 0.3599 | 4722 | 89.4 | 93.6 | 97.6 | 91.3 | 91.3 | 90.7 | 94.6 |
|  | ΔC. → H | 0.0075 | −0.0069 | −290 | −8.3 | −5.0 | −0.4 | −5.9 | −6.8 | −6.3 | −3.2 |
| Dev.2B | 25 (C.) | 0.3444 | 0.3674 | 5075 | 98.6 | 98.5 | 97.7 | 97.8 | 98.7 | 98.0 | 98.5 |
|  | 85 (H) | 0.3522 | 0.3609 | 4777 | 94.7 | 94.7 | 97.4 | 92.2 | 92.5 | 92.1 | 95.2 |
|  | ΔC. → H | 0.0078 | −0.0065 | −298 | −7.8 | −3.8 | −0.3 | −5.6 | −6.2 | −5.9 | −3.3 |

TABLE 11

5000K white light emitting devices - Measured test data

| Device | Temp. (° C.) | R8 | R9 | R10 | R11 | R12 | R13 | R14 | R15 | Ra |
|---|---|---|---|---|---|---|---|---|---|---|
| Com.3 | 25 (C.) | 90.5 | 87.1 | 97.3 | 90.7 | 64.6 | 97.5 | 99.4 | 92.1 | 94.0 |
| Com.4 | 25 (C.) | 97.8 | 96.7 | 98.3 | 97.1 | 97.2 | 99.0 | 98.2 | 97.9 | 98.2 |
|  | 85 (H) | 99.0 | 96.7 | 94.6 | 96.9 | 93.9 | 96.7 | 99.3 | 96.9 | 97.5 |
|  | ΔC. → H | 1.3 | 0.0 | −3.7 | −0.2 | −3.3 | −2.3 | 1.1 | −1.0 | −0.7 |
| Dev.2A | 25 (C.) | 97.8 | 97.2 | 97.6 | 95.9 | 97.4 | 97.7 | 98.2 | 98.5 | 97.8 |
|  | 85 (H) | 89.2 | 74.0 | 88.1 | 89.7 | 89.4 | 90.2 | 97.4 | 89.0 | 92.2 |
|  | ΔC. → H | −8.6 | −23.2 | −9.5 | −6.2 | −8.0 | −7.5 | −0.8 | −9.4 | −5.6 |
| Dev.2B | 25 (C.) | 99.0 | 98.4 | 97.3 | 96.4 | 98.2 | 98.0 | 98.2 | 98.9 | 98.4 |
|  | 85 (H) | 90.5 | 77.7 | 90.3 | 90.5 | 91.7 | 91.6 | 97.4 | 90.8 | 93.2 |
|  | ΔC. → H | −8.5 | −20.7 | −7.0 | −5.9 | −6.5 | −6.4 | −0.8 | −8.1 | −5.2 |

TABLE 12

5000K white light emitting devices -
IES TM-30-15 measured test data

Local Color Fidelity (R$_{f,hj}$) for Hue-Angle Bin (hj)

| Device | h1 | h2 | h3 | h4 | h5 | h6 | h7 | h8 | h9 |
|---|---|---|---|---|---|---|---|---|---|
| Dev.2A | 94 | 93 | 92 | 92 | 94 | 95 | 94 | 93 | 93 |

TABLE 13

5000K white light emitting devices - IES TM-30-15 measured test data

Local Color Fidelity ($R_{f,hj}$) for Hue-Angle Bin (hj)

| Device | h10 | h11 | h12 | h13 | h14 | h15 | h16 | Fidelity Index $R_f$ | Gamut Index $R_g$ |
|---|---|---|---|---|---|---|---|---|---|
| Dev.2A | 95 | 92 | 90 | 89 | 94 | 93 | 94 | 93 | 101 |

It will be appreciated that like devices Dev.1A and 1B, each of devices Dev.2A and Dev.2B produce white light that more closely resembles natural light over this wavelength region 430 nm to 520 nm where human non-visual perception measured by CAF (Circadian Action Factor) or Melanopic Ratio (MR) are affected most and this can be beneficial to human wellbeing.

Figure 15:
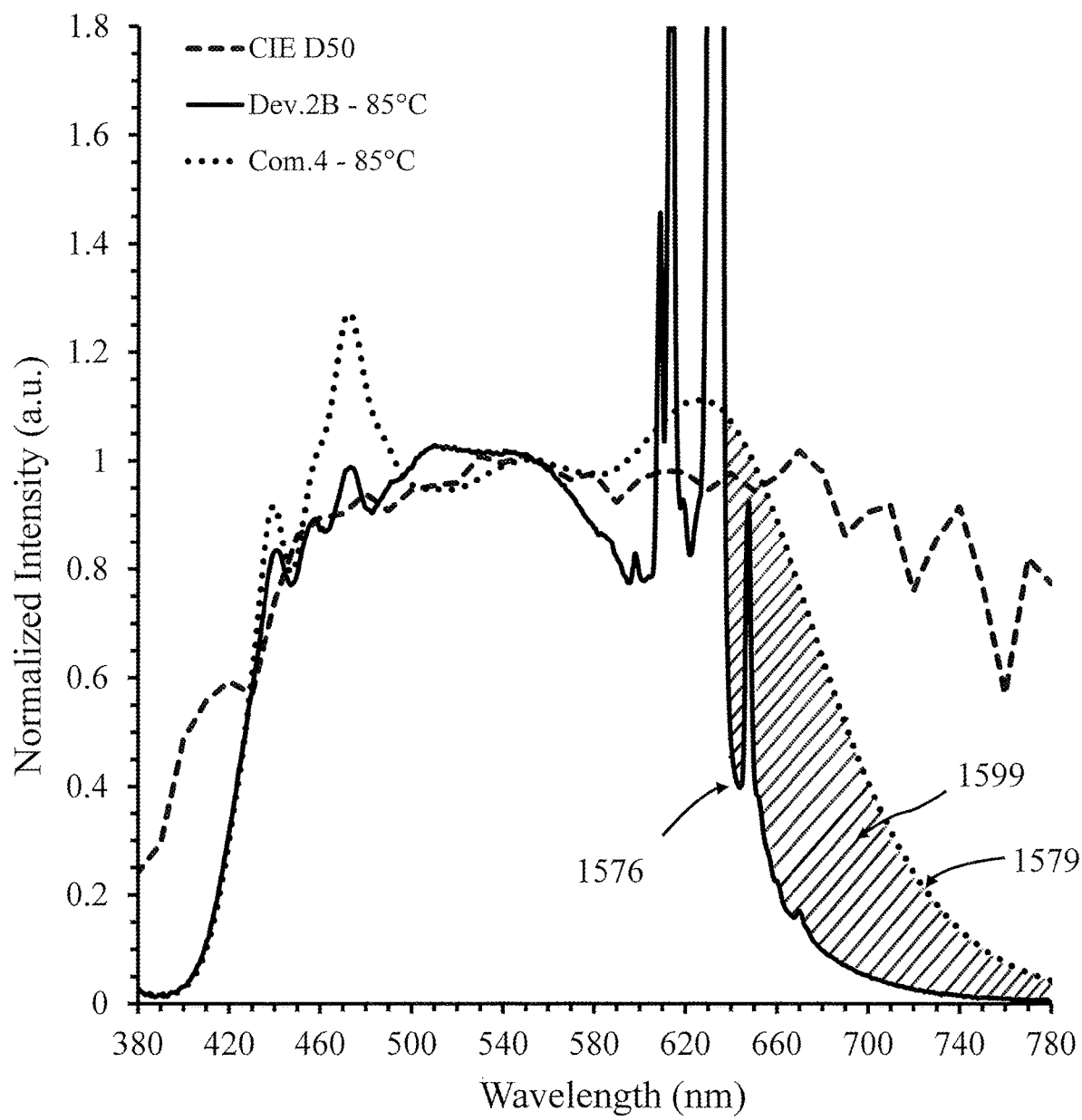
FIG. 15 shows intensity spectra, normalized intensity I versus wavelength (nm) for: (i) Dev. 2B (thin solid line) operated at 25° C., (ii) Dev. 2B (thick solid line) operated at 85° C., (iii) Com.4, and (iv) CIE Standard Illuminant D50 (thick dashed line) for a CCT of 5000K that is nominally the same as Dev. 2B.

FIG. 15 shows intensity spectra, normalized intensity I versus wavelength (nm) for: (i) Dev. 2B (solid line) operated at 85° C., (ii) Com.4 (dotted line) operated at 85° C., and (iii) CIE Standard Illuminant D50 (thick dashed line) for a CCT of 5000K that is nominally the same as Dev. 2B. This figure visually illustrates the effect of using a narrowband red photoluminescence material (Dev.2B) compared with using a broadband red photoluminescence material (Com.4) to reduce light intensity (photon count) in the red wavelength region of the spectrum and thereby improve efficacy. As described above, Comparative device Com. 4 comprises a 2835 packaged white light emitting device which utilizes a broadband excitation source and has a broadband orange to red photoluminescence material (CASN), rather than a narrowband photoluminescence material.

With further Reference to FIG. 15, the cross hatched area denoted 1599 between the dotted line (Com.4) and solid line (Dev.2B) represents the reduction of intensity of light (photon count) in the orange to red wavelength region from 650 nm to 780 nm. As shown in FIG. 15 this reduction in light intensity 1599 is a result of using a narrowband red photoluminescence material (FWHM≤10 nm) that has a tail 1576 that rapidly decreases (drops) in intensity compared with that of the tail 1579 of the broadband red photoluminescence material (FWHM≈70 nm). As described above, the relative intensity of the tail 1576 in the orange to red region of the spectrum of Dev.2A decreases to 25% at a wavelength $\lambda_{125\%}$ of about 655 nm. In comparison, the relative intensity of the tail 1579 in the orange to red region of the spectrum of Com.4 decreases to 25% at a wavelength $\lambda_{125\%}$ of about 720 nm.

Referring to Tables 9 to 11 it is to be noted that Com.4 has an efficacy of 115 lm/W at an operating temperature of 25° C. (C) and an efficacy of 105 lm/W at an operating temperature of 85° C. (H) whereas Dev.2B has an efficacy of 139 lm/W at an operating temperature of 25° C. (C) and an efficacy of 123 lm/W at an operating temperature of 85° C. (H). It is postulated that the increase in efficacy, of about 20%, between Com.4 and Dev.2B is attributable to using a narrowband red photoluminescence material that reduces light intensity in the red region of the spectrum for a wavelength longer than about 650 nm. Moreover, while there is a substantial increase in luminous efficacy (about 20%), there is only a negligible impact on light quality between Com.4 and Dev.2B as evidenced by the general color rendering index CRI Ra, 98.2 (C)→98.4 (C) and 97.5 (H)→93.2 (H) and CIE Color Rendering CRI R1 to R9. It is to be further noted from FIG. 15 that when the large peaks at about 613 nm and 632 nm corresponding to the narrowband red photoluminescence material (KSF) are ignored, white light generated by Dev.2B closely resembles the CIE Standard Illuminant D50 for wavelengths from 420 nm to about 650 nm.

LED-Filament White Light Emitting Device—Test Method

The LED-filament test method involves measuring total light emission of an LED-filament white light emitting device (e.g. FIGS. 6a and 6b) in an integrating sphere. It is impractical to control the temperature of an LED-filament using a temperature controlled plate since light is generated from both faces of an LED-filament. Instead measurements were made at the time the device is turned on (I-Instant) and after it reaches a stable operating state (S-Stable)—typically a few minutes.

LED-filament white light emitting devices in accordance with the invention (Dev.3) is a nominal 2 W device and comprises a 52 mm by 4 mm porous silica substrate with a transmittance≈40% having twenty five serially connected 1133 (11 mil×33 mil) blue narrowband LED dies mounted on a front face. The twenty five LED dies comprise: nine LED dies of dominant wavelength $\lambda_{d1}$=445 nm, eight LED dies of dominant wavelength $\lambda_{d2}$=455 nm and eight LED dies of dominant wavelength $\lambda_{d3}$=465 nm. The LED dies are physically arranged on the substrate sequentially by dominant wavelength; for instance, $\lambda_{d1}$, $\lambda_{d2}$, $\lambda_{d3}$, $\lambda_{d1}$, $\lambda_{d2}$, $\lambda_{d3}$ ... $\lambda_{d1}$. The photoluminescence materials (phosphors) used in the LED-Filaments are KSF phosphor ($K_2SiF_6$:$Mn^{4+}$) from Intematix Corporation, CASN phosphors ($Ca_{1-x}Sr_xAlSiN_3$:Eu), green YAG phosphor $(Y, Ba)_{3-x}(Al_{1-y}Ga_y)_5O_{12}$:$Ce_x$.

The red and green phosphors were mixed in a silicone optical encapsulant and the mixture dispensed onto the front and back faces of the substrate.

Experimental Data—LED-Filament

Tables 14, 15 and 16 tabulate measured optical test data for 4300K LED-filament white light emitting device Dev.3. Tables 17 tabulates measured IEC TM-30-15 optical test data for Dev.3.

LED-filament white light emitting device (Dev.3) is a 2 W device intended to generate white light with a target Correlated Color Temperature (CCT) of 3400K and a target general color rendering index CRI Ra of 95.

The photoluminescence materials (phosphors) used in the Dev.3 are KSF phosphor ($K_2SiF_6$:$Mn^{4+}$) from Intematix Corporation, CASN phosphor ($Ca_{1-x}Sr_xAlSiN_3$:Eu) and green YAG phosphor.

TABLE 14

3400K LED-filament white light emitting device - Measured test data (bbc = black-body curve)

| Device | Temp. (° C.) | Intensity (lm) | Efficacy (lm/W) | Maximum deviation $I_{maxdev}$ (%) | $\lambda_{maxdev}$ (nm) | CIE 1931 CAF (blm/lm) | CAF (%) | MR (blm/lm) | MR (%) | kBv (mW/lm) | kBv (%) |
|---|---|---|---|---|---|---|---|---|---|---|---|
| Dev.3 | I | 369 | 180 | — | — | — | — | — | — | — | — |
|  | S | 418 | 200 | 46 | 440 | 0.48 | 95 | 0.55 | 97 | 0.40 | 88 |
|  | ΔI → S | 49 | 20 | — | — | — | — | — | — | — | — |
| bbc |  | N/A | N/A | N/A | N/A | 0.50 | 100.0 | 0.56 | 100.0 | 0.45 | 100.0 |

TABLE 15

3400K LED-filament white light emitting device - Measured test data

| Device | Test | CIE x | CIE y | CCT (K) | R1 | R2 | R3 | R4 | R5 | R6 | R7 |
|---|---|---|---|---|---|---|---|---|---|---|---|
| Dev.3 | I | 0.4098 | 0.4077 | 3538 | 96.0 | 96.2 | 91.4 | 96.2 | 97.9 | 97.4 | 97.9 |
|  | S | 0.4139 | 0.4028 | 3418 | 98.6 | 98.9 | 92.4 | 93.6 | 97.2 | 98.4 | 98.3 |
|  | ΔI → S | 0.0041 | −0.0049 | −120 | 2.6 | 2.7 | 1.0 | −2.6 | −0.7 | 1.0 | 0.4 |

TABLE 16

3400K LED-filament white light emitting device - Measured test data

| Device | Test | R8 | R9 | R10 | R11 | R12 | R13 | R14 | R15 | Ra |
|---|---|---|---|---|---|---|---|---|---|---|
| Dev.3 | I | 98.3 | 89.6 | 89.3 | 94.9 | 89.5 | 97.8 | 93.9 | 97.3 | 96.8 |
|  | S | 98.5 | 95.5 | 95.0 | 91.4 | 95.6 | 97.4 | 94.2 | 98.5 | 96.7 |
|  | ΔI → S | 0.2 | 5.9 | 5.7 | −3.5 | 6.1 | −0.4 | 0.3 | 1.2 | −0.1 |

TABLE 17

3400K white light emitting devices - IES TM-30-15 measured test data

| Device | Fidelity Index $R_f$ | Gamut Index $R_g$ |
|---|---|---|
| Dev.3 | 93 | 102 |

Figure 16:
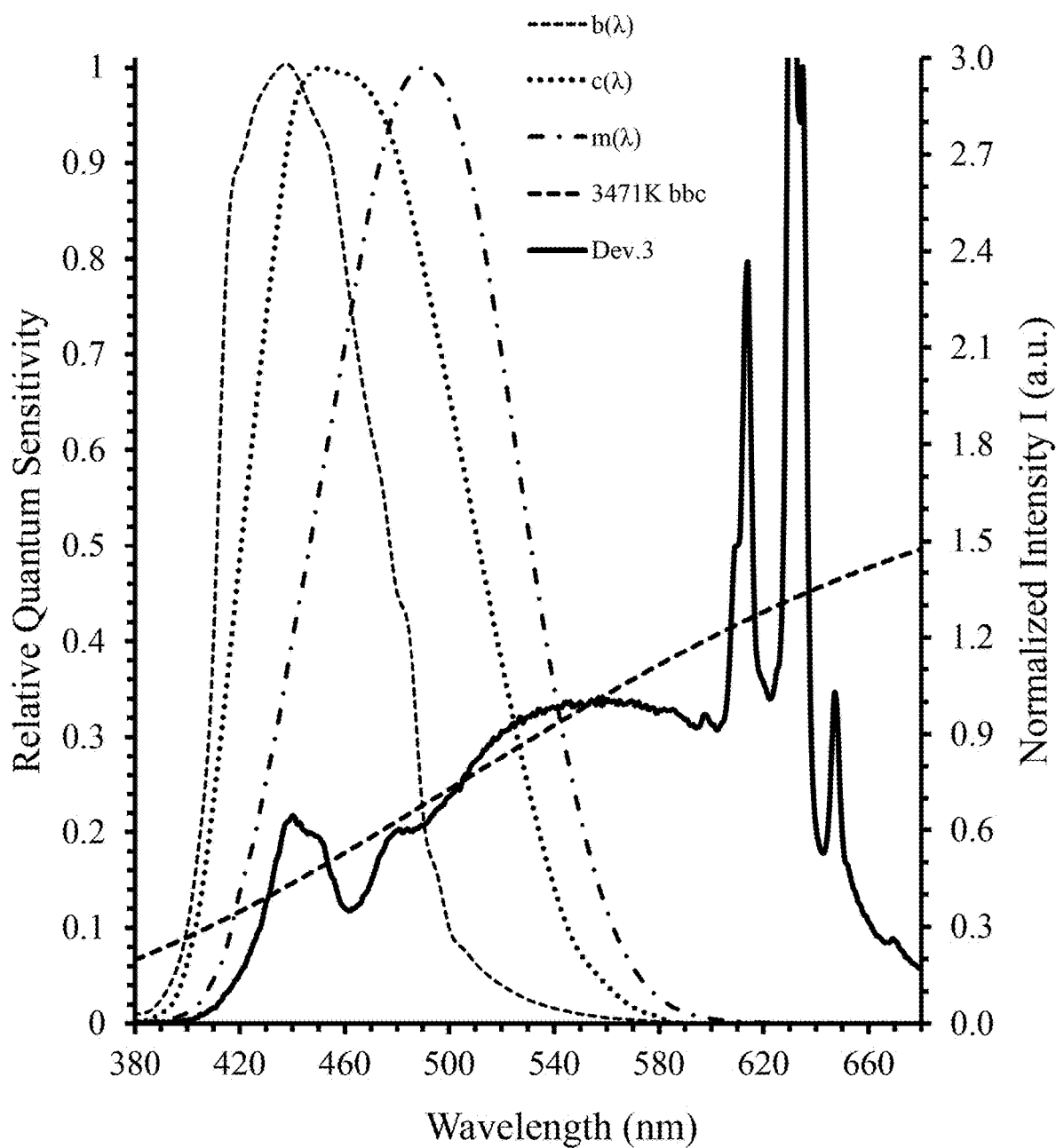
FIG. 16 shows: (A) intensity spectra, normalized intensity I versus wavelength (nm) for: (i) an LED-Filament Dev. 3 (solid line) that has reached a stable operating condition, and (ii) black-body-curve (bbc)—Planckian spectrum (dashed line) for a CCT of 3417K that is the same as Dev. 3; and (B) sensitivity spectra, relative quantum sensitivity versus wavelength (nm) for: (i) Blue Sensitivity $b(\lambda)$ (thin dashed line), (ii) Circadian Sensitivity $c(\lambda)$ (dotted line), and (iii) Melanopic Sensitivity $m(\lambda)$ (dash dot line).

FIG. 16 shows: (A) intensity spectra, normalized intensity I versus wavelength (nm) for: (i) an LED-Filament Dev. 3 (solid line) that has reached a stable operating condition, and (ii) black-body-curve (bbc)—Planckian spectrum (dashed line) for a CCT of 3417K that is the same as Dev. 3; and (B) sensitivity spectra, relative quantum sensitivity versus wavelength (nm) for: (i) Blue Sensitivity b(λ) (thin dashed line), (ii) Circadian Sensitivity c(λ) (dotted line), and (iii) Melanopic Sensitivity m(λ) (dash dot line). Analysis of the spectrum indicates that at a stable operating condition (S) over a wavelength range 430 nm to 520 nm (blue to cyan), a maximum percentage normalized intensity deviation $I_{maxdev}$ of about 46% between the normalized intensity of light emitted by device Dev.3 and the normalized intensity of light of the Planckian spectrum of the same Correlated Color Temperature (4317K). This is to be contrasted with the known LED-filaments, that utilize narrowband excitation light source, which generate white light that exhibits a maximum percentage deviation $I_{maxdev}$ in normalized intensity of over 100%. The relative intensity of the tail 1676 in the orange to red region of the spectrum of Dev.3 decreases to 25% at a wavelength $\lambda_{125\%}$ of about 655 nm.

Referring to Tables 14, 15 and 16, it is to be noted that when turned on (Instant—I) device Dev.3 has an efficacy of 180 lm/W and produces white light with a General Color Rendering Index CRI Ra of 96.8 with CRI R1 to R15 from 89.3 to 98.3. When operated at stable operating condition (S), the efficacy of device Dev.3 increases to 200 lm/W and produces white light with a General Color Rendering Index CRI Ra of 96.7 with each of CRI R1 to R15 being at least 90 or higher (91.4 to 98.9).

Referring to Table 17, in terms of IES TMS-30-15 metrics, Dev.3 produces white light with a Gamut Index $R_g$ of 101 and Fidelity Index $R_f$ of 93.

As described above, a particular advantage of the present invention is that full spectrum white light emitting devices according to embodiments of the invention can generate full spectrum light that closely resembles natural light in blue to cyan (430 nm to 520 nm) region where human non-visual perception measured by CAF (Circadian Action Factor) or Melanopic Ratio (MR) are affected most. There has been much discussion in the lighting industry regarding blue light stimulation and its impact on circadian rhythm. The amount of blue to cyan light in a light source impacts melatonin secretion which can impact the circadian cycle. High levels of blue to cyan light suppress melatonin secretion, energizing the human body. Low levels of blue light do not suppress melatonin secretion, relaxing the human body. One metric used to estimate this non-visual effect is the CAF Circadian Action Factor, which typically is modulated by blue content throughout the day. At noon time the sun has a high CCT and higher blue to cyan content. Sunrise and sunset have a lower CCT and lower blue to cyan content. CAF value of natural light at a different CCT is a good measure of the lighting deviation from natural light in blue to cyan region where human emotional, health, or wellbeing are affected.

In summary, it will be appreciated that light emitting devices in accordance with the invention comprising a broadband solid-state excitation source enable the implementation of full spectrum white light emitting devices that are characterized by generating white light having a color temperature in a range 1800K to 6800K with one or more of: (i) an efficacy of at least 130 lm/W at an operating temperature of 25° C., (ii) over a wavelength range from about 430 nm to about 520 nm, a maximum percentage intensity deviation of the white light from the intensity of light of a black-body curve or CIE Standard Illuminant D of the same Correlated Color Temperature is less than about 60%, 50%, 40%, 30%, 20% or 15%; (iii) a spectrum that closely resembles the black-body curve/CIE Standard Illuminant D for wavelengths from 420 nm to 650 nm, (iv) a spectrum having a CAF that is within 20% or 10% of the black-body curve/CIE Standard Illuminant D; (v) a tail in the orange to red wavelength region whose relative intensity to that of the black-body curve or CIE Standard Illuminant D of the same Correlated Color Temperature decreases to 25% at a wavelength from about 635 nm to about 675 nm, from about 645 nm to about 665 nm or is about 655 nm; (vi) a CRI R9 and/or a CRI R8 at least 50 and/or less than 90, (vii) a spectrum whose having a CRI Ra greater than or equal to 90, CRI R1 to CRI R8 and CRI R10 to CRI R15 greater than or equal to 90, and CRI R9 greater than 50, (viii) a spectrum having a CRI Ra greater than or equal to 90 and each of CRI R1 to CRI R15 greater than or equal to 90, and (ix) a spectrum having an IEC TM-30 Gamut Index $R_g$ of at least 98 and/or an IEC TM-30 Fidelity Index $R_f$ of at least 90, an IEC TM-30 local color fidelity $R_{f,hj}$ for hue angle-bins h1 to h12 and h13 to h16 of at least about 90 and h13 of at least 85.

As used in this document, both in the description and in the claims, and as customarily used in the art, the words "substantially," "approximately," and similar terms of approximation are used to account for manufacturing tolerances, manufacturing variations, and manufacturing imprecisions that are inescapable parts of fabricating and/or operating any mechanism, structure and/or composition of matter in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the abstract of this document, and any summary statements in this document, are merely exemplary; they are not, and cannot be interpreted as, limiting the scope of the claims; the purpose of the abstract is to enable the U.S. Patent and Trademark Office, as well as readers who are not familiar with patent or legal terms or phraseology, to determine quickly from a cursory inspection the nature and essence of the technical disclosure of the application. Further, the figures are merely exemplary and not limiting. Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. Therefore, the invention is not to be restricted or limited except in accordance with the following claims and their legal equivalents. Although the present invention has been particularly described with reference to certain embodiments thereof, it should be readily apparent to those of ordinary skill in the art that changes and modifications in the form and details may be made without departing from the spirit and scope of the invention.

What is claimed is:

1. A full spectrum white light emitting device comprising:
   a broadband solid-state excitation source for generating broadband excitation light with a dominant wavelength from about 420 nm to about 480 nm and a full width at half maximum intensity greater than about 25 nm; and
   a narrowband red photoluminescence material with an emission peak wavelength from about 620 nm to about 640 nm and a full width at half maximum emission intensity of less than about 30 nm;
   wherein the device has an efficacy of at least 130 lm/W and generates white light with a CRI Ra≥90, and
   wherein over a wavelength range from about 430 nm to about 520 nm, a maximum percentage intensity deviation of said white light from the intensity of light of a black-body curve or CIE Standard Illuminant D of the same Correlated Color Temperature is less than about 50%.

2. The light emitting device of claim 1, wherein light generated by the device has a Correlated Color Temperature from about 1800K to about 6800 K.

3. The light emitting device of claim 1, wherein the narrowband red photoluminescence material comprises at least one of $K_2SiF_6:Mn^{4+}$, $K_2TiF_6:Mn^{4+}$ and $K_2GeF_6:Mn^{4+}$.

4. The light emitting device of claim 1, wherein the device is one of a surface mountable device, chip on board, and filament.

5. The light emitting device of claim 1, wherein light generated by the device has a color rendering CRI R9 of at least 50.

6. The light emitting device of claim 1, wherein light generated by the device has color rendering CRI R1 to CRI R15 being at least 90.

7. The light emitting device of claim 1, wherein light generated by the device has a color rendering CRI R1 to CRI R8 and CRI R10 to CRI R15 of at least 80.

8. The light emitting device of claim 1, wherein light generated by the device has an IEC TM-30 Gamut Index $R_g$ of at least 98 and an IEC TM-30 Fidelity Index $R_f$ of at least 90.

9. The light emitting device of claim 1, wherein light generated by the device has an IEC TM-30 local color fidelity $R_{f,hj}$ for hue angle-bins h1 to h12 and h13 to h16 of at least 90 and h13 of at least 85.

10. The light emitting device of claim 1, wherein light generated by the device has a Circadian Action Factor that is within 20% or 10% of the black-body curve or CIE Standard Illuminant D.

11. The light emitting device of claim 1, further comprising a yellow to green photoluminescence material with a peak emission wavelength in a range from 495 nm to 580 nm.

12. The light emitting device of claim 1, further comprising a red to orange photoluminescence material with a peak emission wavelength in a range from 580 nm to 625 nm.

13. The light emitting device of claim 1, wherein the broadband excitation light comprises at least two blue light emissions.

14. The light emitting device of claim 13, wherein the broadband solid-state excitation source comprises:
- a first solid-state light source for generating the first blue light emission with a first dominant wavelength from 420 nm to 480 nm; and
- a second solid-state light source for generating the second different blue light emission with a second dominant wavelength from 420 nm to 480 nm.

15. The light emitting device of claim 13, wherein the broadband solid-state excitation source comprises an LED with at least two different quantum wells that each generate a respective one of the at least two different wavelength blue light emissions.

16. The light emitting device of claim 1, wherein the maximum percentage intensity deviation is less than at least one of 40%, 30%, 20% and 15%.

17. A full spectrum white light emitting device comprising:
- a broadband solid-state excitation source for generating broadband excitation light with a dominant wavelength from about 420 nm to about 480 nm and a full width at half maximum intensity greater than about 25 nm; and
- a narrowband red photoluminescence material with an emission peak wavelength from about 620 nm to about 640 nm and a full width at half maximum emission intensity less than about 30 nm;
- wherein the device generates white light with a Circadian Action Factor that is within 20% or 10% of the black-body curve or CIE Standard Illuminant D.

18. A full spectrum white light emitting device comprising:
- a broadband solid-state excitation source for generating broadband excitation light with a dominant wavelength from about 420 nm to about 480 nm and a full width at half maximum intensity greater than about 25 nm; and
- a narrowband red photoluminescence material;
- wherein the device generates a white light spectrum having a tail in the orange to red wavelength region whose relative intensity to that of the black-body curve or CIE Standard Illuminant D of the same Correlated Color Temperature decreases to 25% at a wavelength from about 635 nm to about 675 nm.

19. The light emitting device of claim 18, wherein the device generates white light having a tail in the orange to red region whose relative intensity to that of the black-body curve or CIE Standard Illuminant D of the same Correlated Color Temperature decreases to 25% at a wavelength from about 645 nm to about 665 nm.

* * * * *